US009348182B2

(12) United States Patent
Yoshida et al.

(10) Patent No.: US 9,348,182 B2
(45) Date of Patent: May 24, 2016

(54) ACTIVE MATRIX SUBSTRATE AND DISPLAY DEVICE

(71) Applicant: Sharp Kabushiki Kaisha, Osaka-shi, Osaka (JP)

(72) Inventors: Masahiro Yoshida, Osaka (JP); Isao Ogasawara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/436,950

(22) PCT Filed: Nov. 1, 2013

(86) PCT No.: PCT/JP2013/079716
§ 371 (c)(1),
(2) Date: Apr. 20, 2015

(87) PCT Pub. No.: WO2014/073481
PCT Pub. Date: May 15, 2014

(65) Prior Publication Data
US 2015/0286084 A1   Oct. 8, 2015

(30) Foreign Application Priority Data

Nov. 8, 2012  (JP) ................................. 2012-246027

(51) Int. Cl.
*H01L 27/12*   (2006.01)
*H01L 21/77*   (2006.01)
(Continued)

(52) U.S. Cl.
CPC .......... *G02F 1/13454* (2013.01); *G02F 1/1345* (2013.01); *G02F 1/1368* (2013.01); *G02F 1/13439* (2013.01); *G02F 1/133345* (2013.01); *G02F 1/136209* (2013.01); *G02F 1/136227* (2013.01); *G02F 1/136286* (2013.01); *H01L 27/124* (2013.01); *H01L 27/1214* (2013.01); *H01L 27/1248* (2013.01);
(Continued)

(58) Field of Classification Search
CPC .............. H01L 27/124; H01L 27/1248; H01L 29/7869; H01L 27/1214; H01L 2021/775; G02F 1/13452; G02F 1/1345; G02F 2001/13456; G02F 1/133345; G02F 1/13439; G02F 1/136209; G02F 1/136227; G02F 1/136286; G02F 1/1368; G02F 1/13454
See application file for complete search history.

(56) References Cited

U.S. PATENT DOCUMENTS

| 2008/0117345 | A1* | 5/2008 | Ishii .................. G02F 1/136204 349/40 |
| 2009/0153008 | A1* | 6/2009 | Yanagisawa ........ G02F 1/13452 313/51 |
| 2011/0234964 | A1* | 9/2011 | Moriwaki ........... G02F 1/13452 349/149 |

FOREIGN PATENT DOCUMENTS

| JP | 2009-145849 A | 7/2009 |
| JP | 2012-123475 A | 6/2012 |

*Primary Examiner* — Galina Yushina
(74) *Attorney, Agent, or Firm* — Keating & Bennett, LLP

(57) ABSTRACT

An active matrix substrate (5) is provided with mounting terminals (DT1), draw-out lines (22r) connecting the mounting terminals (DT1) and data bus lines (D), first common wires (24) connected in common to the plurality of data bus lines (D), and second thin-film transistors (second switching elements) (23a) connected between the draw-out lines (22r) and the first common wires (24). In the mounting terminals (DT1), upper-layer terminal electrodes (34) and lower-layer terminal electrodes (36a, 36b) are connected via terminal contact holes (H2a). The upper-layer terminal electrodes (34) are provided so as to cover at least portions of second thin-film transistors (26a).

13 Claims, 24 Drawing Sheets

(51) Int. Cl.
  *G02F 1/1345*  (2006.01)
  *G02F 1/1333*  (2006.01)
  *G02F 1/1343*  (2006.01)
  *G02F 1/1362*  (2006.01)
  *G02F 1/1368*  (2006.01)
  *H01L 29/786*  (2006.01)

(52) U.S. Cl.
  CPC . *H01L 29/7869* (2013.01); *G02F 2001/13456* (2013.01); *H01L 2021/775* (2013.01)

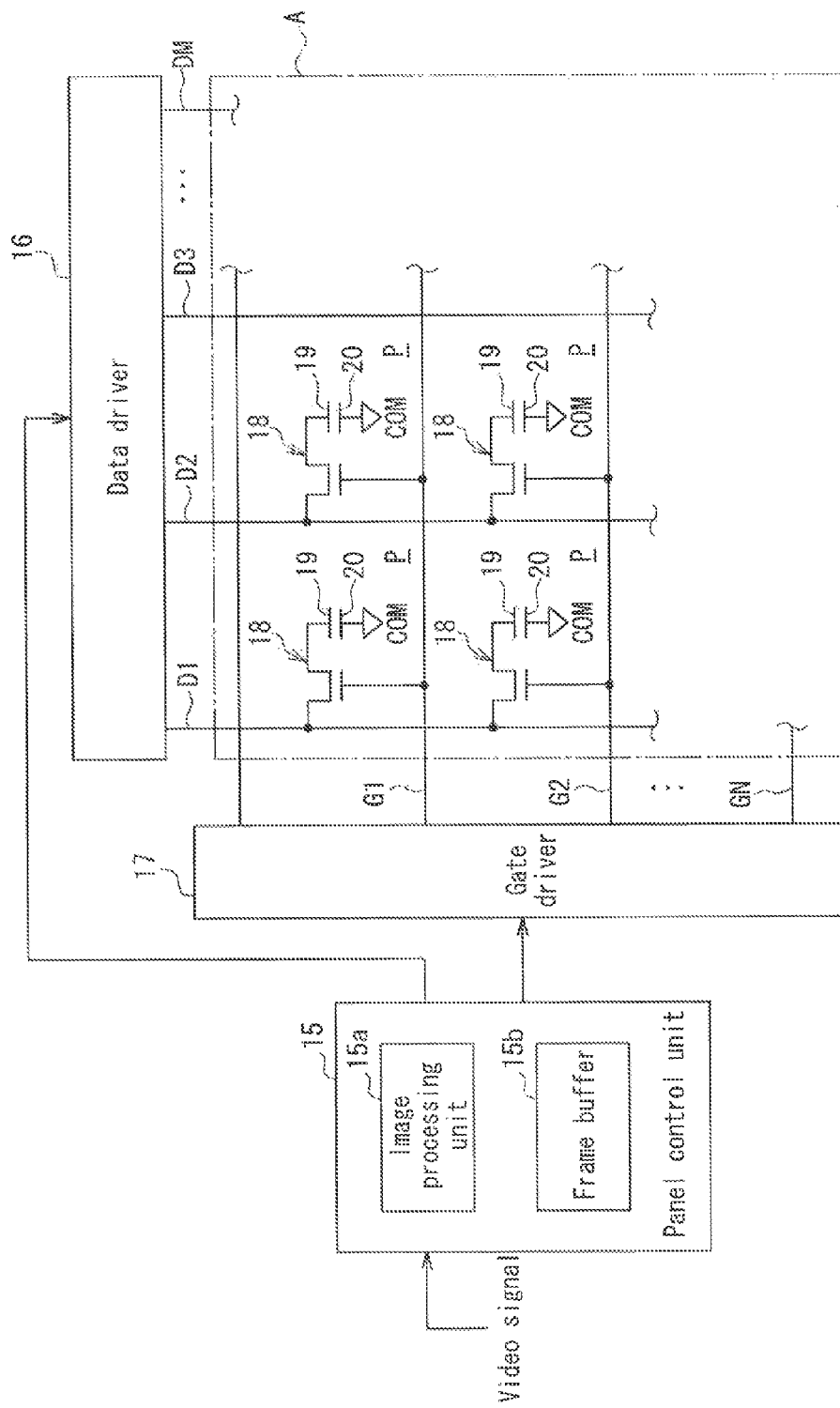
F I G. 2

ACTIVE MATRIX SUBSTRATE AND DISPLAY DEVICE

TECHNICAL FIELD

The present invention relates to an active matrix substrate including gate bus lines and data bus lines, and to a display apparatus incorporating the same.

BACKGROUND ART

In recent years, for example, liquid crystal display apparatuses are widely used in liquid crystal televisions, monitors, mobile telephones, and the like as flat panel displays that are advantageously thin and lightweight compared to conventional cathode ray tubes. In some known examples of such liquid crystal display apparatuses, a liquid crystal panel serving as a display panel incorporates an active matrix substrate on which a plurality of data bus lines (source wires) and a plurality of gate bus lines (scan wires) are arranged in a matrix pattern, and pixels are arranged in a matrix pattern as well. The pixels are in the vicinity of intersections between the data bus lines and the gate bus lines, and each pixel includes a switching element (first switching element), such as a thin-film transistor (TFT), and a pixel electrode connected to the switching element.

As is known in the art, in concert with downsized frames of liquid crystal display apparatuses, the aforementioned conventional active matrix substrate has inspection thin-film transistors (second switching elements), which are arranged in the vicinity of a portion on which a driver chip (IC chip) of a data driver (source driver) and/or a gate driver is mounted, for the purpose of inspecting the corresponding data bus lines or gate bus lines.

Furthermore, with regard to the conventional active matrix substrate, it has been suggested to provide a first potion and a second portion to the aforementioned portion on which the driver is mounted, as described in, for example, the below-listed Patent Document 1. Here, the first portion contains ITO (upper-layer terminal electrodes of mounting terminals) connected to bumps of the driver and includes terminal contact holes for connecting ITO and the corresponding data bus lines or gate bus lines, whereas the second portion contains only ITO. It has been considered that this conventional active matrix substrate enables formation of the mounting terminals in the portion on which the driver is mounted, even if a wiring pitch of the data bus lines and/or the gate bus lines is reduced in accordance with high-definition properties of liquid crystal display apparatuses.

PRIOR ART DOCUMENTS

Patent Document

[Patent Document 1] JP 2009-145849A

DISCLOSURE OF INVENTION

Problem to be Solved by the Invention

However, in the aforementioned conventional active matrix substrate, the inspection thin-film transistors (second switching elements) are arranged continuously with the aforementioned first portion and second portion. Therefore, this conventional active matrix substrate gives rise to the problem that, when a region of the portion on which the driver is mounted, i.e., a region for mounting the driver is small (when a driver IC chip is small), the inspection thin-film transistors cannot be arranged within the region for mounting the driver.

In view of the aforementioned problem, the present invention aims to provide an active matrix substrate on which second switching elements can be easily installed even if a region for mounting a driver is small, as well as a display apparatus incorporating such an active matrix substrate.

Means for Solving Problem

In order to achieve the aforementioned aim, an active matrix substrate of the present invention includes: a base member; a gate bus line provided on the base member; a data bus line provided in a layer different from a layer of the gate bus line via an insulating film therebetween; a first switching element connected to the gate bus line and the data bus line; an interlayer insulating film provided so as to cover the first switching element, the interlayer insulating film having at least one layer; a pixel electrode connected to the first switching element; a mounting terminal for supplying a signal from a driver to the gate bus line or the data bus line; a draw-out line connecting the mounting terminal and the gate bus line or the data bus line; a plurality of second switching elements that are each connected to a corresponding one of a plurality of draw-out lines constituting the draw-out line; and a first common wire connected in common to the plurality of second switching elements. In the mounting terminal, an upper-layer terminal electrode and a lower-layer terminal electrode are connected via a terminal contact hole that is formed in at least one layer in the interlayer insulating film. The lower-layer terminal electrode is formed from at least one of the same conductive layer as the gate bus line and the same conductive layer as the data bus line. Each of the plurality of second switching elements is arranged between the first common wire and the terminal contact hole. The upper-layer terminal electrode is provided so as to cover at least a portion of each of the plurality of second switching elements.

On the active matrix substrate constructed in the foregoing manner, the upper-layer terminal electrode and the lower-layer terminal electrode are connected via the terminal contact hole in the mounting terminal. Also, the second switching elements are arranged between the aforementioned first common wire and terminal contact hole. Furthermore, the upper-layer terminal electrode is provided so as to cover at least a portion of the second switching elements. In this way, unlike the aforementioned conventional examples, the second switching elements can be easily installed even if a region for mounting the driver is small.

Furthermore, the aforementioned active matrix substrate may include: a third switching element connected to an end portion of the gate bus line or the data bus line to which the mounting terminal is not connected; and a second common wire connected in common to a plurality of third switching elements constituting the third switching element.

In this case, the third switching elements and the second common wire are provided in a section where the aforementioned mounting terminal is not provided. Therefore, the configurations at the mounting terminal side, such as the configuration of the aforementioned first common wire, can be simplified, and the second switching elements can be installed more easily even if the region for mounting the driver is small.

Furthermore, on the aforementioned active matrix substrate, it is preferable that the second common wire be constituted by a plurality of second common wires, and a predetermined number of the third switching elements be connected to each of the plurality of second common wires.

In this case, operation processing, such as inspection processing and voltage application processing, can be performed per predetermined number of the aforementioned gate bus lines or data bus lines using the second common wires.

Furthermore, on the aforementioned active matrix substrate, it is preferable that the first common wire be constituted by a plurality of first common wires, and a predetermined number of the second switching elements be connected to each of the plurality of first common wires.

In this case, operation processing, such as inspection processing and voltage application processing, can be performed per predetermined number of the aforementioned gate bus lines or data bus lines using the first common wires.

Furthermore, it is preferable that, among the plurality of draw-out lines on the aforementioned active matrix substrate, one of two neighboring draw-out lines be formed from the same conductive layer as the gate bus line, and the other of the two neighboring draw-out lines be formed from the same conductive layer as the data bus line.

In this case, the occurrence of a short circuit and disconnection of the draw-out lines can be inhibited.

Furthermore, on the aforementioned active matrix substrate, it is preferable that the first common wire be constituted by a plurality of first common wires, two of the second switching elements that are connected respectively to two neighboring draw-out lines among the draw-out lines formed from the same conductive layer as the gate bus line be each connected to a different one of the first common wires, and two of the second switching elements that are connected respectively to two neighboring draw-out lines among the draw-out lines formed from the same conductive layer as the data bus line be each connected to a different one of the first common wires.

In this case, an inspection operation to check whether a short circuit has occurred can be easily performed by using the first common wires with respect to the draw-out lines formed from the same conductive layer as the gate bus line, as well as the draw-out lines formed from the same conductive layer as the data bus line.

Furthermore, on the aforementioned active matrix substrate, it is preferable that the mounting terminal include: a first lower-layer terminal electrode constituted by an end portion of a draw-out line formed from the same conductive layer as the gate bus line; and a second lower-layer terminal electrode that is constructed integrally with an electrode of the second switching elements and is formed from the same conductive layer as the data bus line, and it is also preferable that the first and second lower-layer terminal electrodes be connected to each other at the terminal contact hole.

In this case, cross-connection between the draw-out lines formed from the same conductive layer as the gate bus line and the electrode of the second switching elements formed from the same conductive layer as the data bus line can be implemented at the terminal contact hole. In this way, regions dedicated to such cross-connection need not be provided, and the dimension of the external shape of the active matrix substrate can be easily reduced.

Furthermore, on the aforementioned active matrix substrate, it is preferable that the mounting terminal include: a third lower-layer terminal electrode formed from the same conductive layer as the gate bus line; and a fourth lower-layer terminal electrode that is constituted by an end portion of a draw-out line formed from the same conductive layer as the data bus line and is constructed integrally with an electrode of the second switching elements, and it is also preferable that the third and fourth lower-layer terminal electrodes be connected to each other at the terminal contact hole.

In this case, all mounting terminals can be constructed in the same manner regardless of the configuration of the aforementioned draw-out lines, and an inspection for the state of the driver mounted on the mounting terminals can be easily carried out.

Furthermore, the aforementioned active matrix substrate may include: a common electrode that is made from transparent electrode material and is provided above or below the pixel electrode; and a metal electrode provided in a layer above or below the common electrode. At least a portion of the second switching elements may be covered by a light shielding film formed from the metal electrode.

In this case, defective display can be inhibited as the metal electrode is provided with respect to the common electrode. Also, an inspection operation using the second switching elements and the like can be performed with high precision as at least a portion of the second switching elements is covered by the light shielding film formed from the metal electrode.

Furthermore, in the mounting terminal of the aforementioned active matrix substrate, the terminal contact hole may be constituted by a plurality of terminal contact holes.

In this case, defective contact between the mounting terminal and the driver can be easily reduced.

Furthermore, on the aforementioned active matrix substrate, it is preferable that the upper-layer terminal electrode be formed from the same conductive layer as the pixel electrode.

In this case, an active matrix substrate with a simple configuration can be easily constructed in simple manufacturing processes.

Furthermore, on the aforementioned active matrix substrate, it is preferable that an oxide semiconductor be used for both the first and second switching elements.

In this case, high-performance and compact switching elements can be easily constructed, and an inspection operation using the second switching elements can be performed with high precision.

A display apparatus of the present invention incorporates any one of the aforementioned active matrix substrates.

The display apparatus constructed in the foregoing manner incorporates the active matrix substrate on which the second switching elements can be easily installed even if the region for mounting the driver is small. Therefore, the high-performance and compact display apparatus can be easily constructed.

Effects of the Invention

The present invention makes it possible to provide an active matrix substrate on which second switching elements can be easily installed even if a region for mounting a driver is small, as well as a display apparatus incorporating such an active matrix substrate.

BRIEF DESCRIPTION OF DRAWINGS

FIG. 2 is a diagram for describing a configuration of a liquid crystal panel shown in FIG. 1.

DESCRIPTION OF THE INVENTION

Figure 1:
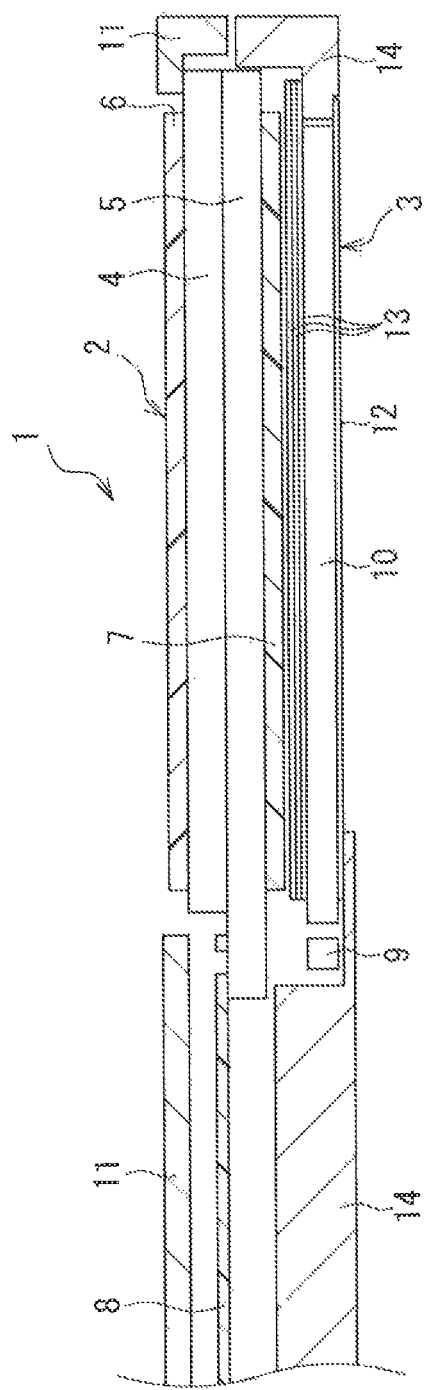
FIG. 1 is a diagram for describing a liquid crystal display apparatus incorporating an active matrix substrate according to a first embodiment of the present invention.

The following describes preferred embodiments of an active matrix substrate and a display apparatus of the present invention with reference to the drawings. It should be noted that the following description will be given using an example case in which the present invention is applied to a transmissive liquid crystal display apparatus. Furthermore, the dimensions of constituent elements in the drawings are not precise representations of the actual dimensions of the constituent elements, the actual dimensional ratios of the constituent elements, etc.

First Embodiment

FIG. 1 is a diagram for describing a liquid crystal display apparatus incorporating an active matrix substrate according to a first embodiment of the present invention. In FIG. 1, a liquid crystal display apparatus 1 according to the present embodiment includes a liquid crystal panel 2 and a backlight apparatus 3. The liquid crystal panel 2 is arranged with an upper side thereof in FIG. 1 serving as a viewing side (a display surface side). The backlight apparatus 3 is arranged at a non-display surface side (a lower side in FIG. 1) of the liquid crystal panel 2, and produces illumination light for illuminating the liquid crystal panel 2.

The liquid crystal panel 2 includes a counter substrate 4 and an active matrix substrate 5 of the present invention, which constitute a pair of substrates, as well as polarizing plates 6 and 7 that are provided on the outer surfaces of the counter substrate 4 and the active matrix substrate 5, respectively. A later-described liquid crystal layer is held between the counter substrate 4 and the active matrix substrate 5. Planar, transparent glass material or transparent synthetic resin, such as acrylic resin, is used for the counter substrate 4 and the active matrix substrate 5. Resin films made from triacetyl cellulose (TAC), polyvinyl alcohol (PVA), or the like are used for the polarizing plates 6, 7. The polarizing plates 6, 7 are each attached to a corresponding one of the counter substrate 4 and the active matrix substrate 5 so as to cover at least an effective display region on a display surface of the liquid crystal panel 2. There are cases in which a λ/4 retarder (a quarter wave plate) is arranged between the polarizing plates 6, 7 and the liquid crystal layer.

The active matrix substrate 5 is one of the aforementioned pair of substrates. Pixel electrodes, thin-film transistors (TFTs), and the like are formed between the active matrix substrate 5 and the aforementioned liquid crystal layer in correspondence with a plurality of pixels included in the display surface of the liquid crystal panel 2 (the details will be described later). On the other hand, the counter substrate 4 is the other of the pair of substrates (counter substrate), and includes color filters, a counter electrode, and the like that are formed so as to oppose the aforementioned liquid crystal layer (not shown).

The liquid crystal panel 2 is also provided with a flexible printed circuit (FPC) 8 connected to a control apparatus (not shown) that performs drive control of the liquid crystal panel 2. By operating the aforementioned liquid crystal layer on a pixel-by-pixel basis, the display surface is driven on a pixel-by-pixel basis, thereby displaying a desired image on the display surface.

It should be noted that the liquid crystal panel 2 may have any liquid crystal mode and pixel structure. The liquid crystal panel 2 may also have any driving mode. That is to say, any liquid crystal panel capable of displaying information can be used as the liquid crystal panel 2. Therefore, a detailed configuration of the liquid crystal panel 2 is not shown in FIG. 1, and a description thereof is also omitted.

The backlight apparatus 3 includes a light emitting diode 9 serving as a light source, and a light guiding plate 10 that is arranged to oppose the light emitting diode 9. Furthermore, in the backlight apparatus 3, the light emitting diode 9 and the light guiding plate 10 are held by a bezel 14 having an L-shaped cross section, with the liquid crystal panel 2 arranged above the light guiding plate 10. A case 11 is mounted on the counter substrate 4. In this way, the backlight apparatus 3 is attached to the liquid crystal panel 2. They are integrated as the transmissive liquid crystal display apparatus 1 in which illumination light from the backlight apparatus 3 is incident on the liquid crystal panel 2.

Synthetic resin, such as transparent acrylic resin, is used for the light guiding plate 10, and light from the light emitting diode 9 enters the light guiding plate 10. A reflecting sheet 12 is arranged at a side of the light guiding plate 10 opposite from the liquid crystal panel 2 (counter surface side). Optical sheets 13, such as a lens sheet and a diffusion sheet, are provided at the liquid crystal panel 2 side (light emitting surface side) of the light guiding plate 10. Light from the light emitting diode 9 is guided inside the light guiding plate 10 in a predetermined light guiding direction (in FIG. 1, a direction from the left side to the right side), converted into the aforementioned illumination light that is planar and has uniform luminance, and then supplied to the liquid crystal panel 2.

Although the foregoing description has introduced a configuration with the edge-lit backlight apparatus 3 having the light guiding plate 10, the present embodiment is not limited in this way, and a direct-lit backlight apparatus may be used. It is also possible to use a backlight apparatus having the light source other than the light emitting diode, such as a cold cathode fluorescent tube and a hot cathode fluorescent tube.

Specifics of the liquid crystal panel 2 according to the present embodiment will now be described, additionally with reference to FIG. 2.

FIG. 2 is a diagram for describing a configuration of the liquid crystal panel shown in FIG. 1.

In FIG. 2, the liquid crystal display apparatus 1 (FIG. 1) is provided with a panel control unit 15 that performs drive control of the aforementioned liquid crystal panel 2 (FIG. 1) serving as a display unit for displaying information such as characters and images, as well as a data driver (source driver) 16 and a gate driver 17 that operate based on instruction signals from the panel control unit 15.

The panel control unit 15 is provided in the aforementioned control apparatus and receives, as input, a video signal from outside the liquid crystal display apparatus 1. The panel control unit 15 includes an image processing unit 15a that applies predetermined image processing to the input video signal and generates instruction signals to the data driver 16 and the gate driver 17, and a frame buffer 15b that can store display data corresponding to one frame included in the input video signal. The panel control unit 15 performs drive control of the data driver 16 and the gate driver 17 in accordance with the input video signal. As a result, information corresponding to the video signal is displayed on the liquid crystal panel 2.

The data driver 16 and the gate driver 17 are arranged on the active matrix substrate 5. Specifically, the data driver 16 is arranged on a surface of the active matrix substrate 5 so as to extend along the horizontal direction of the liquid crystal panel 2, which serves as a display panel, in a region outside an effective display region A of the liquid crystal panel 2. On the other hand, the gate driver 17 is arranged on the surface of the active matrix substrate 5 so as to extend along the vertical direction of the liquid crystal panel 2 in the region outside the aforementioned effective display region A. It should be noted that the gate driver 17 may be made up of two separate gate drivers that are provided with the effective display region A interposed therebetween, as will be described later in detail, or the gate driver 17 may be arranged so as to extend along the horizontal direction of the liquid crystal panel 2.

The data driver 16 and the gate driver 17 are drive circuits that drive a plurality of pixels P in the liquid crystal panel 2 on a pixel-by-pixel basis. The data driver 16 and the gate driver 17 are connected respectively to a plurality of data bus lines (source wires) D1 to DM (M is an integer equal to or larger than two, and hereinafter these lines are collectively referred to as "D") and a plurality of gate bus lines (gate wires) G1 to GN (N is an integer equal to or larger than two, and hereinafter these lines are collectively referred to as "G"). These data bus lines D and gate bus lines G are arrayed in a matrix pattern such that they intersect on a later-described base member that is included in the active matrix substrate 5 and is made from transparent glass material or transparent synthetic resin. That is to say, the data bus lines D are provided on the aforementioned base member in parallel to the column direction of the matrix (the vertical direction of the liquid crystal panel 2), whereas the gate bus lines G are provided on the aforementioned base member in parallel to the row direction of the matrix (the horizontal direction of the liquid crystal panel 2).

The aforementioned pixels P are provided in the vicinity of intersections between the data bus lines D and the gate bus lines G. Each pixel P includes a first thin-film transistor 18 serving as a first switching element, and a pixel electrode 19 connected to the first thin-film transistor 18. Each pixel P is structured such that a counter electrode 20 opposes the pixel electrode 19 with the aforementioned liquid crystal layer in the liquid crystal panel 2 interposed therebetween. That is to say, on the active matrix substrate 5, the first thin-film transistors 18 and the pixel electrodes 19 are provided in one-to-one relationship with the pixels.

Furthermore, on the active matrix substrate 5, regions of the plurality of pixels P are each formed in a corresponding one of regions that are defined by the data bus lines D and the gate bus lines G in a matrix pattern. The plurality of pixels P include red (R), green (G), and blue (B) pixels. The R, G, and B pixels are arranged sequentially in parallel to each of the gate bus lines G1 to GN in this order, for example. The R, G, and B pixels can display corresponding colors with a layer of the aforementioned color filters provided on the counter substrate 4.

On the active matrix substrate 5, based on an instruction signal from the image processing unit 15a, the gate driver 17 sequentially outputs scan signals (gate signals) to the gate bus lines G1 to GN for placing gate electrodes of the corresponding first thin-film transistors 18 in an on state. Based on an instruction signal from the image processing unit 15a, the data driver 16 outputs data signals (voltage signals (gradation voltages)) compliant with the luminance (gradation) of a display image to the corresponding data bus lines D1 to DM.

Specifics of main elements of the active matrix substrate 5 according to the present embodiment will now be described, additionally with reference to FIGS. 3 to 10.

Figure 3:
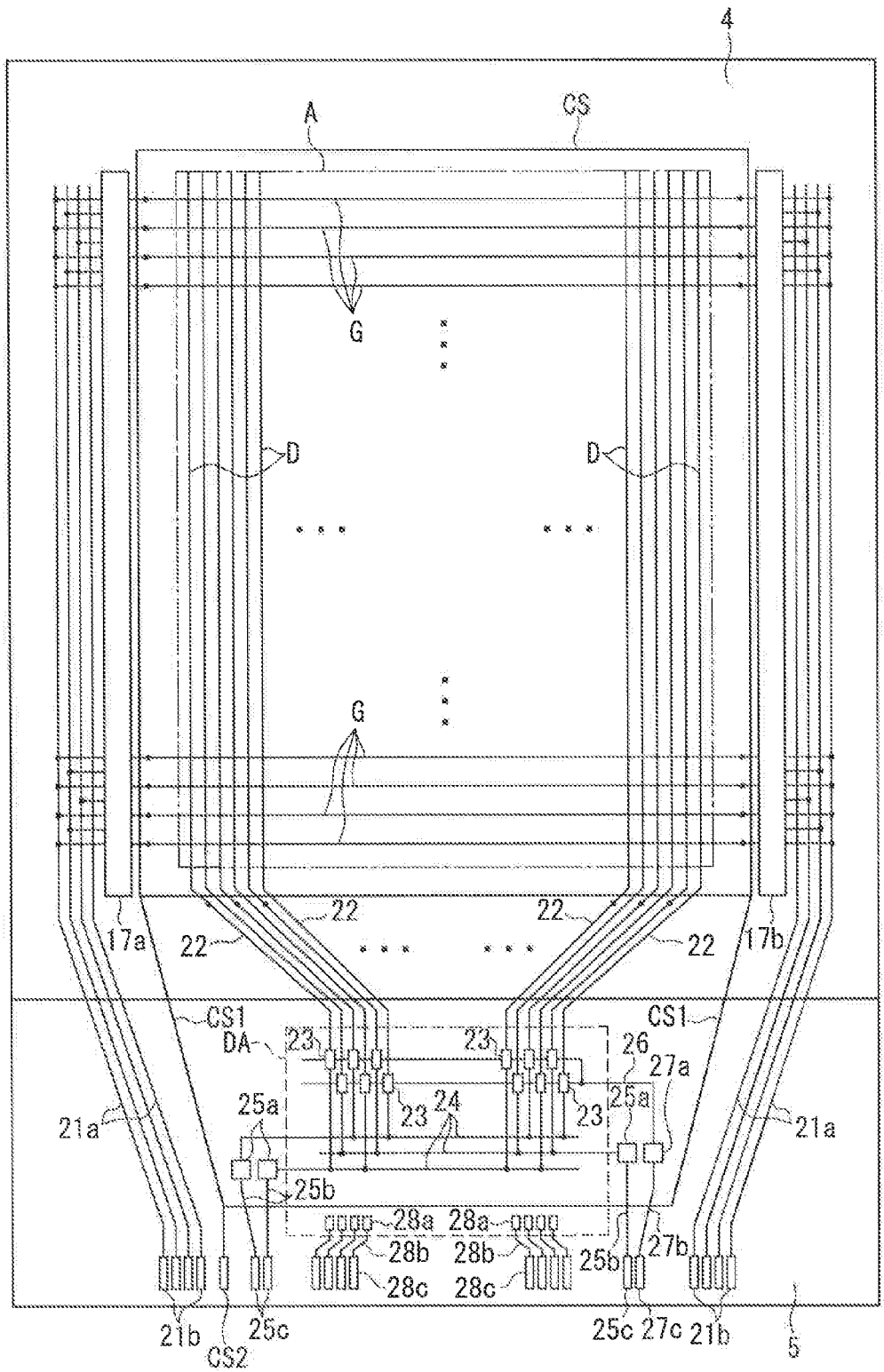
FIG. 3 is a plan view for describing main elements of the aforementioned active matrix substrate.
Figure 4:
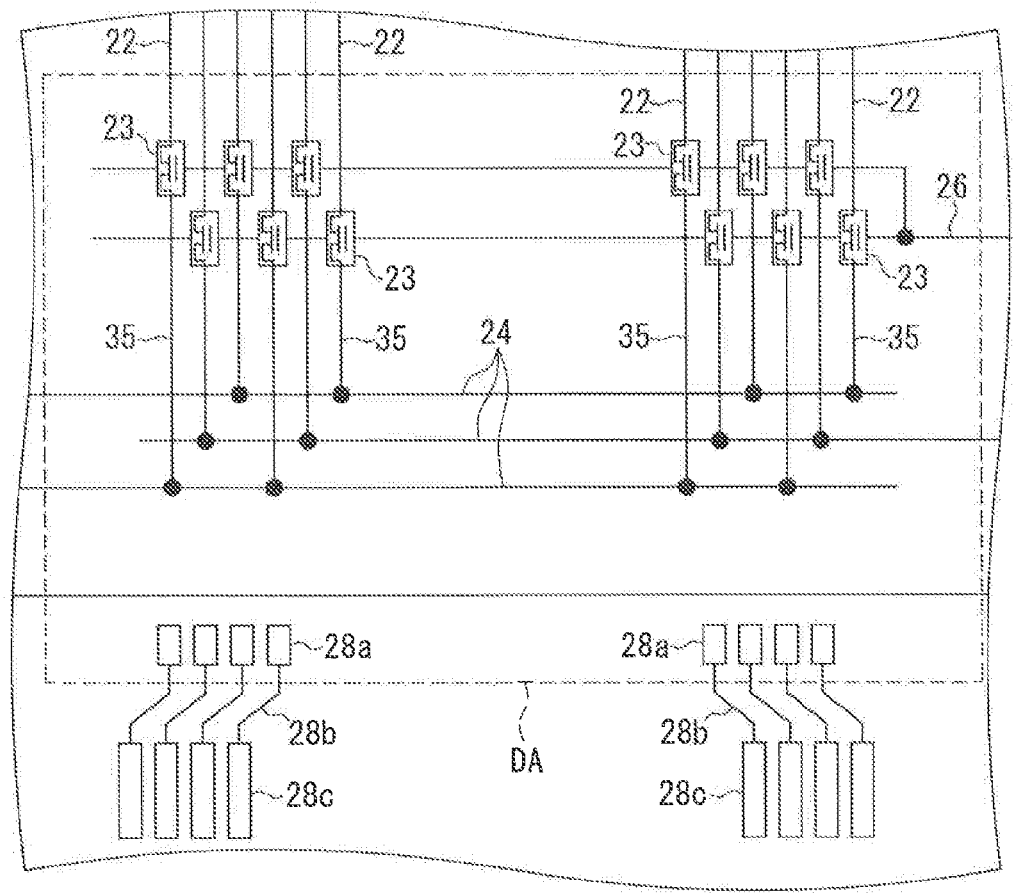
FIG. 4 is an enlarged plan view for describing a portion on which a data driver is mounted, which is shown in FIG. 3.
Figure 5:
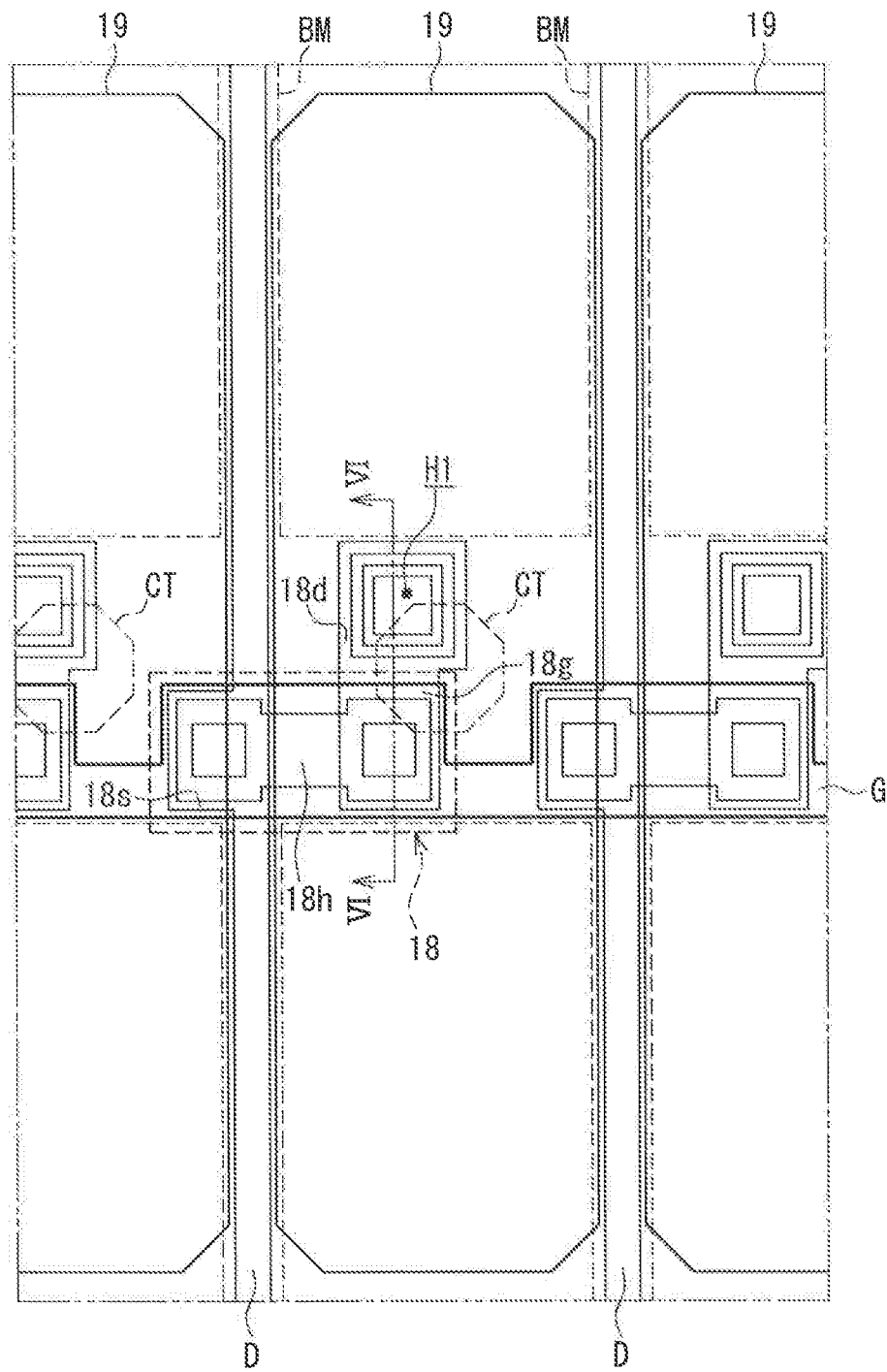
FIG. 5 is an enlarged plan view for describing a pixel structure of the aforementioned liquid crystal panel.
Figure 6:
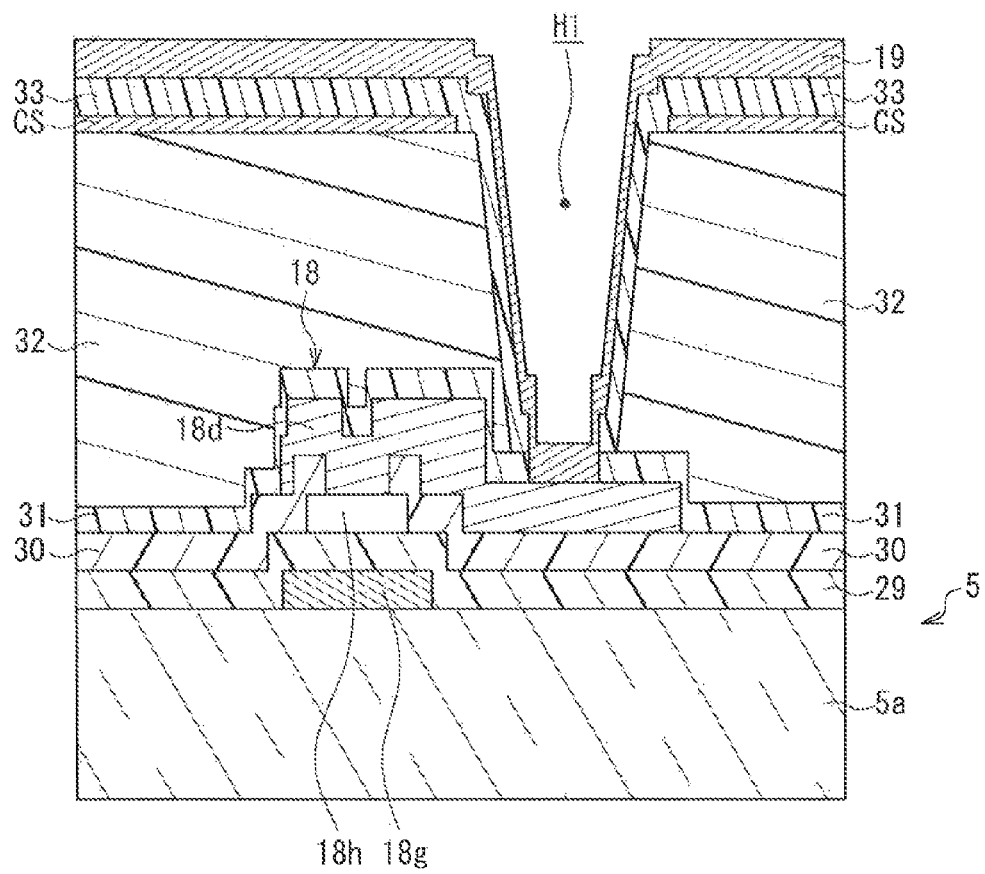
FIG. 6 is a cross-sectional view taken along the line VI-VI of FIG. 5.
Figure 7:
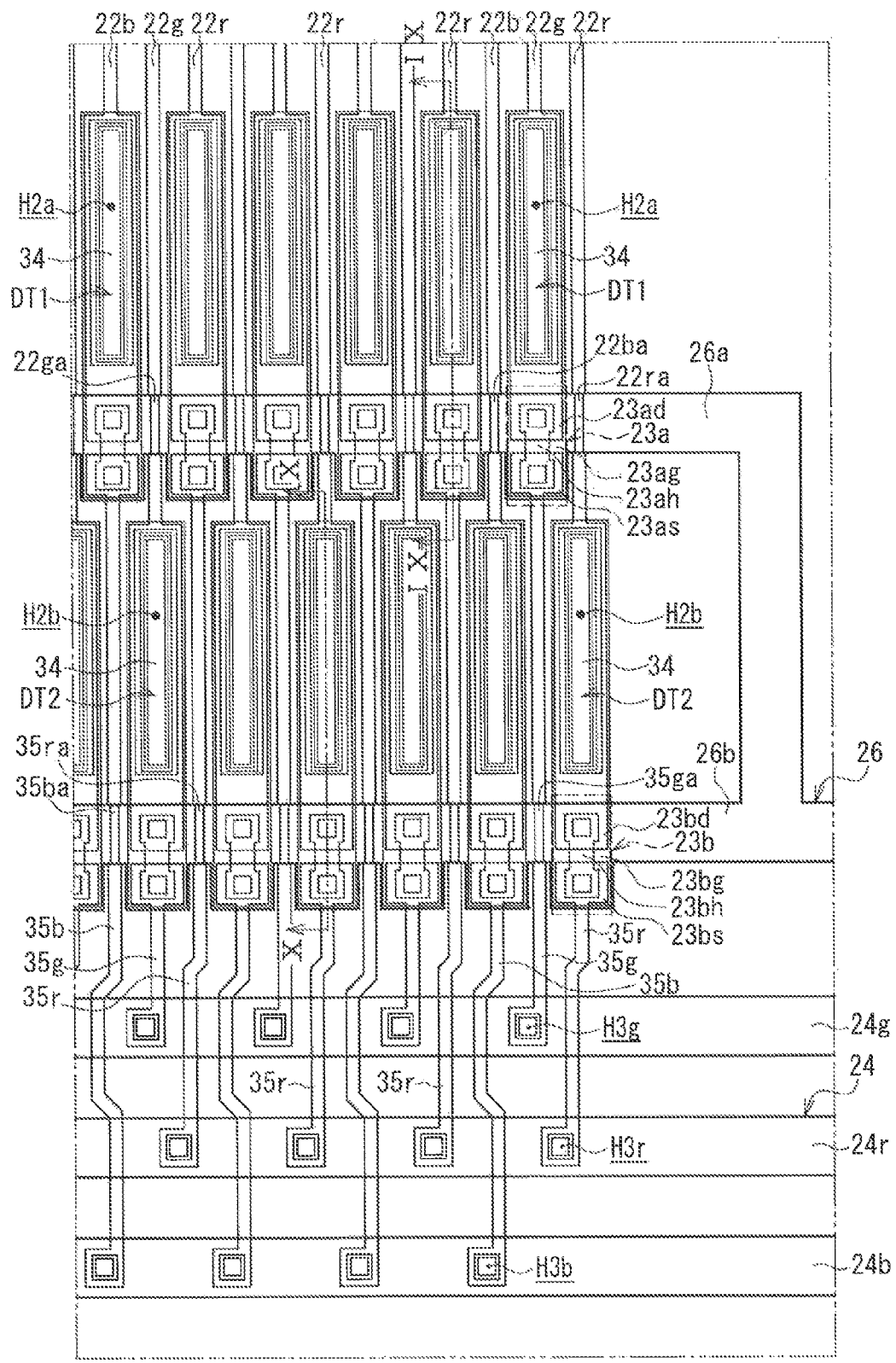
FIG. 7 is a diagram for describing configurations of main elements of the active matrix substrate shown in FIG. 3.
Figure 8:
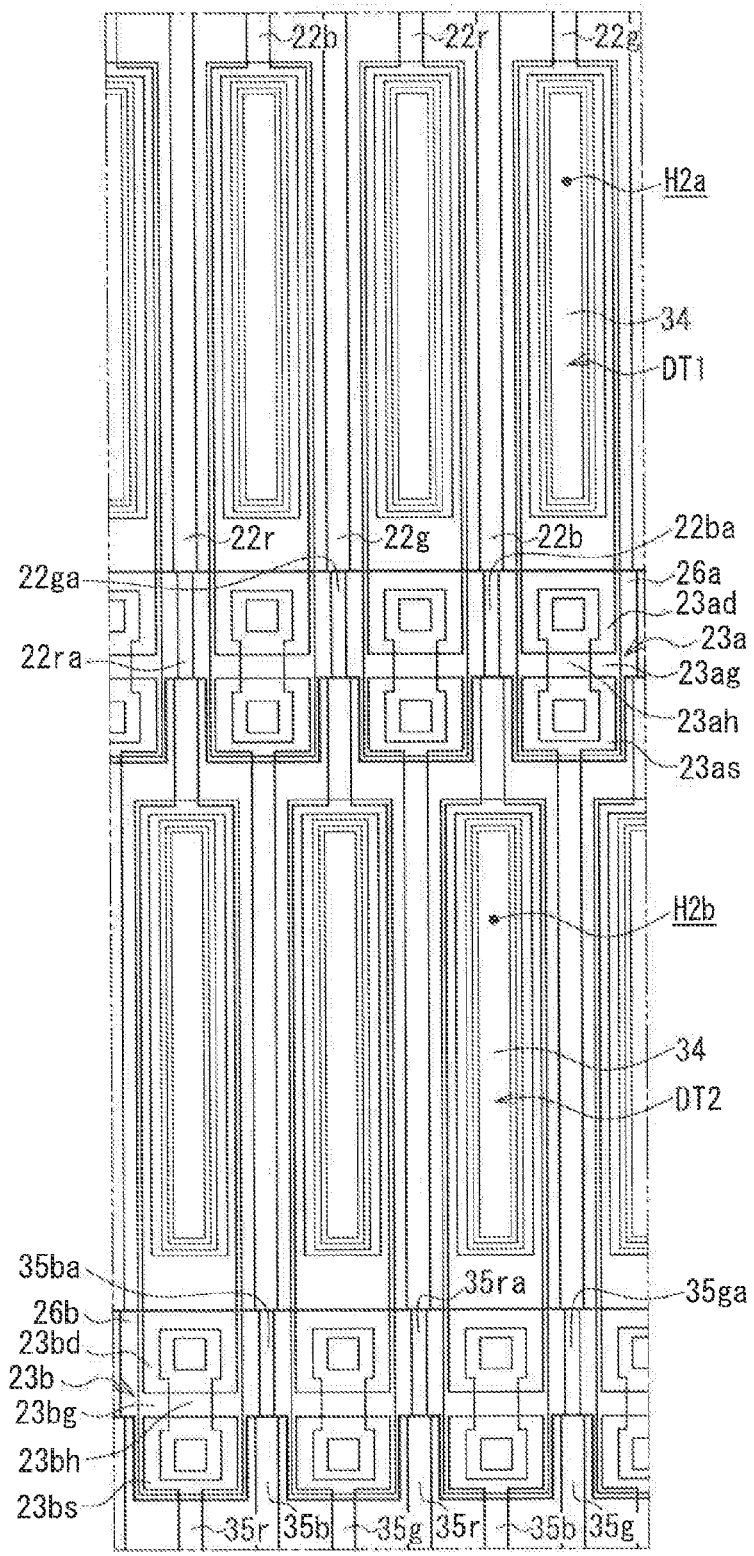
FIG. 8 is an enlarged plan view for describing mounting terminals and second thin-film transistors shown in FIG. 7.
Figure 9:
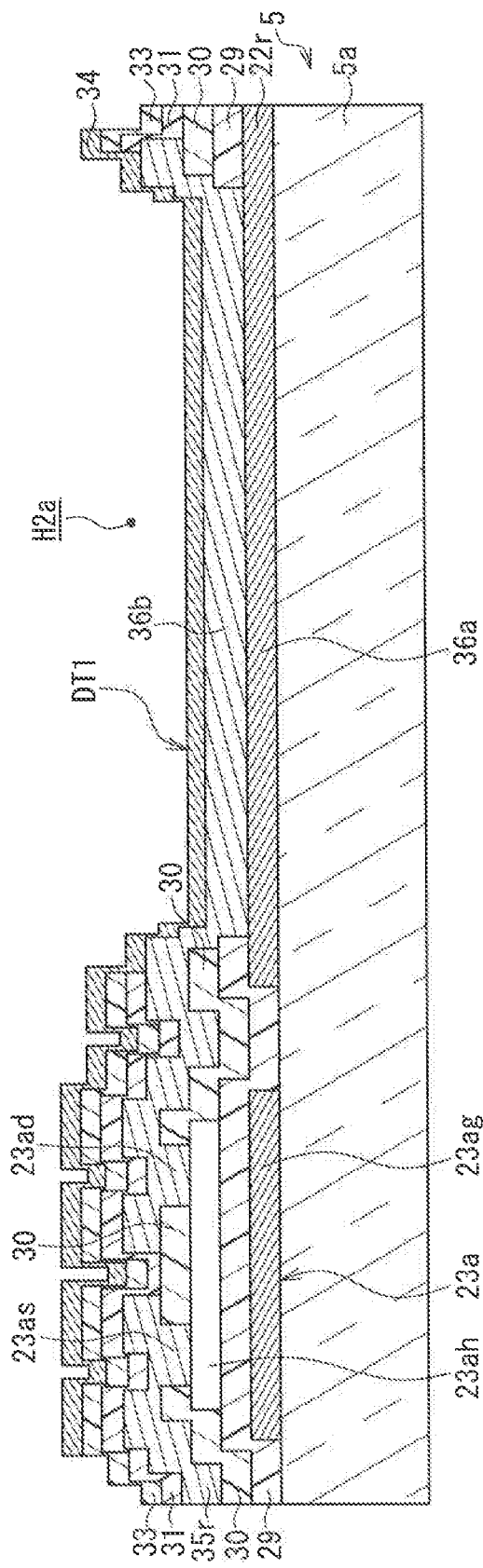
FIG. 9 is a cross-sectional view taken along the line IX-IX of FIG. 7.
Figure 10:
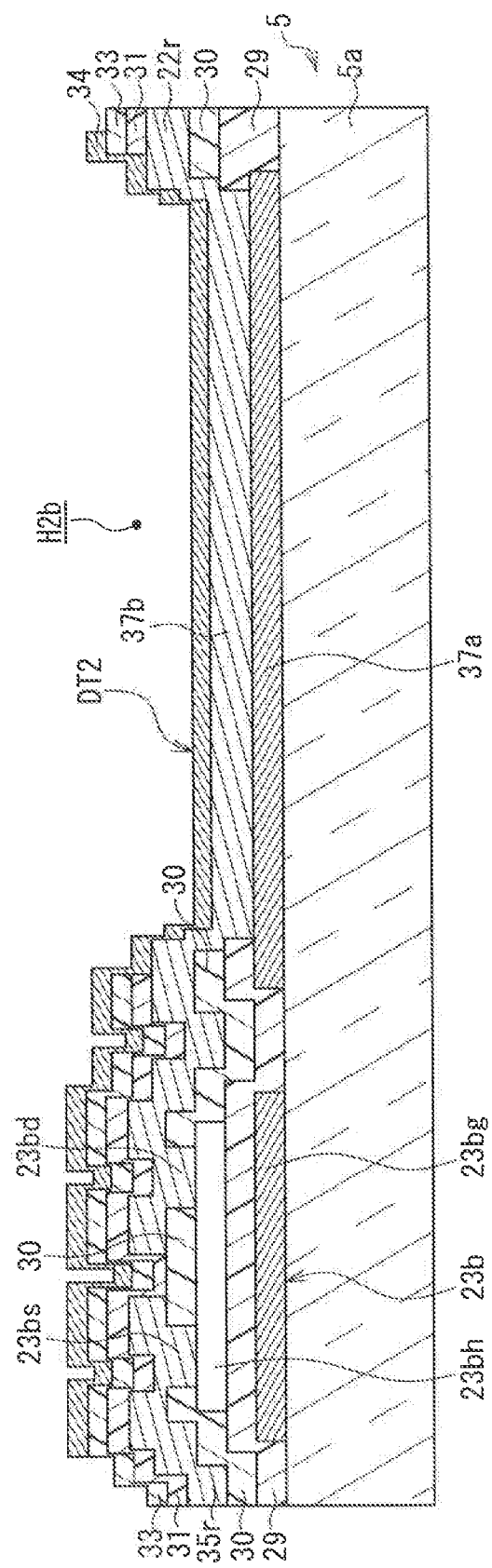
FIG. 10 is a cross-sectional view taken along the line X-X of FIG. 7.

FIG. 3 is a plan view for describing main elements of the aforementioned active matrix substrate. FIG. 4 is an enlarged plan view for describing a portion on which the data driver is mounted, which is shown in FIG. 3. FIG. 5 is an enlarged plan view for describing a pixel structure of the aforementioned liquid crystal panel. FIG. 6 is a cross-sectional view taken along the line VI-VI of FIG. 5. FIG. 7 is a diagram for describing configurations of main elements of the active matrix substrate shown in FIG. 3. FIG. 8 is an enlarged plan view for describing mounting terminals and second thin-film transistors shown in FIG. 7. FIG. 9 is a cross-sectional view taken along the line IX-IX of FIG. 7. FIG. 10 is a cross-sectional view taken along the line X-X of FIG. 7.

As shown in FIG. 3, on the active matrix substrate 5, the plurality of data bus lines D and the plurality of gate bus lines G are arrayed in a matrix pattern in a portion covered by the counter substrate 4. Furthermore, the aforementioned effective display region A is provided as indicated by a line with alternating long and short dashes in FIG. 3.

In the effective display region A, the plurality of gate bus lines G are formed in a gate layer, a later-described gate insulating film is provided so as to cover the gate bus lines G, and the plurality of data bus lines D are formed above the gate insulating film, i.e., in a source layer. In the present embodiment, the data bus lines D and the gate bus lines G are wires that are provided within the effective display region A. It should be noted that the points of connection between the bus lines formed in the source layer and the bus lines formed in the gate layer are indicated by black dots in FIG. 3 (the same goes for FIG. 22 to follow). In addition to the foregoing description, for example, the bus lines labeled G (the bus lines extending in the horizontal direction of the sheet) may be the data bus lines, and the bus lines labeled D (the bus lines extending in the vertical direction of the sheet) may be the gate bus lines.

On the aforementioned base member of the active matrix substrate 5, gate drivers 17a, 17b are monolithically formed with the effective display region A interposed therebetween. All of the plurality of gate bus lines G are connected to the gate driver 17a at their left end portions, and to the gate driver 17b at their right end portions. The gate drivers 17a, 17b are connected to gate driver driving signal terminals 21b via gate driver driving signal wires 21a. FPC connection terminals of the aforementioned FPC 8 are connected to the gate driver driving signal terminals 21b, and an instruction signal from the image processing unit 15a is input to the gate drivers 17a, 17b via the FPC 8. In addition to the foregoing description, the plurality of gate bus lines G may be connected alternately to the left and right gate drivers 17a, 17b, and a gate driver may be provided only at one side of the effective display region A. Furthermore, the gate drivers 17a, 17b may be composed of an IC chip and mounted on the aforementioned base member.

On the aforementioned base member of the active matrix substrate 5, an auxiliary capacitance electrode CS is provided to generate a predetermined auxiliary capacitance for each of the pixels P. The auxiliary capacitance electrode CS is connected to an auxiliary capacitance electrode driving signal terminal CS2 via auxiliary capacitance electrode driving signal wires CS1. The FPC connection terminals of the aforementioned FPC 8 are connected to the auxiliary capacitance electrode driving signal terminal CS2, and voltage is supplied to the auxiliary capacitance electrode CS. The auxiliary capacitance electrode CS constitutes a common electrode, is made from transparent electrode material, and is provided below the pixel electrodes 19 (the details will be described later).

The data driver 16 is composed of, for example, an IC chip (driver chip), and is mounted on a rectangular portion of a base member 5a of the active matrix substrate 5 indicated by a dash line DA in FIGS. 3 and 4, which is outside the effective display region A.

Specifically, bumps (electrodes) of the data driver 16 are connected to later-described mounting terminals that are provided continuously with second thin-film transistors 23 serving as second switching elements, and to input mounting terminals 28a provided at the FPC 8 side. The second thin-film transistors 23 are provided in one-to-one relationship with the data bus lines D, and draw-out lines 22 connecting the aforementioned mounting terminals and the data bus lines D are connected to the second thin-film transistors 23. The draw-out lines 22 are also provided in one-to-one relationship with the data bus lines D, and constitute a fan-out portion (oblique portion) that is arranged to be oblique with respect to the data bus lines D as shown in FIG. 3. As will be described later in detail, among the draw-out lines 22, two neighboring draw-out lines 22 are formed from different conductive layers.

The input mounting terminals 28a are connected to data driver driving signal terminals 28c via data driver driving signal wires 28b. The FPC connection terminals of the aforementioned FPC 8 are connected to the data driver driving signal terminals 28c, and an instruction signal from the image processing unit 15a is input to the data driver 16 via the FPC 8.

The region of the portion on which the data driver 16 is mounted, which is labeled DA in FIGS. 3 and 4, is provided with the plurality of aforementioned second thin-film transistors 23, three first common wires 24, connection wires 35 that each connect one of the plurality of second thin-film transistors 23 and one of the three first common wires 24, and a control line 26 that controls an operation to turn on/off each of the plurality of second thin-film transistors 23. The second thin-film transistors 23, the first common wires 24, the connection wires 35, and the control line 26 are installed for the purpose of performing predetermined operation processing, e.g., inspection processing and countermeasures against static electricity with respect to each of the plurality of data bus lines D, or voltage application processing performed in alignment processing for liquid crystal molecules in the aforementioned liquid crystal layer.

That is to say, as will be described later in detail, the plurality of data bus lines D are each connected to one of the first common wires 24 via one of the draw-out lines 22, one of the second thin-film transistors 23, and one of the connection wires 35 for each of the colors R, G, B, for example. The first common wires 24 are connected to corresponding terminals 25a that are connected to input terminals 25c via wires 25b. The FPC connection terminals of the aforementioned FPC 8 are connected to the input terminals 25c. An inspection signal associated with the aforementioned inspection processing and voltage associated with the aforementioned voltage application processing are input from the terminals 25a or the input terminals 25c. In the liquid crystal display apparatus 1 as a final product, the input terminals 25c are earthed via the aforementioned FPC 8.

As will be described later in detail, the draw-out lines 22, the connection wires 35, and the first common wire 24 are provided for each of the colors R, G, B. The aforementioned, continuously-provided mounting terminals are staggered in two rows, and the second thin-film transistors 23 are classified as second thin-film transistors 23a or 23b in accordance with the arrangements of the mounting terminals (the details will be described later).

A terminal 27a is connected to the control line 26. The terminal 27a is also connected to an input terminal 27c via a wire 27b. The FPC connection terminals of the aforementioned FPC 8 are connected to the input terminal 27c. When performing the inspection processing and the voltage application processing, a control signal for performing an operation to turn on/off each of the plurality of second thin-film transistors 23 is input from the terminal 27a or the input terminal 27c. In the liquid crystal display apparatus 1 as a final product, a signal for turning off each of the second thin-film transistors 23 is input to the input terminal 27c via the aforementioned FPC 8.

With reference to FIGS. 5 and 6, the following describes a specific structure of the pixels P provided in the active matrix substrate 5 according to the present embodiment.

As shown in FIGS. 5 and 6, the gate bus lines G (gate layer) and gate electrodes 18g of the first thin-film transistors 18 that are constructed integrally with the gate bus lines G are provided on the aforementioned base member 5a of the active matrix substrate 5 according to the present embodiment. Layered metal films forming a multi-layer structure are used for the gate bus lines G and the gate electrodes 18g. Examples thereof include metal films forming a two-layer structure—e.g., layers of a copper film and a titanium film, layers of a copper film and a molybdenum film, and layers of a copper film and a molybdenum alloy film—or metal films forming a three-layer structure—e.g., layers of an aluminum film, a titanium film, and an aluminum film, and layers of a molybdenum film, an aluminum film, and a molybdenum film. There are cases in which a molybdenum film, an aluminum film, a chromium film, or a film of an alloy thereof is used as a single layer.

A gate insulating film 29 is provided so as to cover the base member 5a, the gate bus lines G, and the gate electrodes 18g. The gate insulating film 29 constitutes an insulating film. For example, silicon nitride (SiNx) or layered films of silicon nitride (SiNx) and silicon oxide ($SiO_2$) are used for the gate insulating film 29.

Semiconductor layers 18h of the first thin-film transistors 18 are formed on the gate insulating film 29. For example, an oxide semiconductor is used for the semiconductor layers 18h. An In—Ga—Zn—O-based, amorphous oxide semiconductor containing In, Ga, and Zn at a ratio of 1:1:1 is favorably used as the oxide semiconductor. It should be noted that the ratio of In, G, and Zn is not limited to the aforementioned ratio, and any appropriate ratio may be chosen. Other oxide semiconductor films may be used in place of the In—Ga—Zn—O-based oxide semiconductor film.

For example, the semiconductor layers 18h may be formed from a film of $InGaO_3$ (ZnO), magnesium zinc oxide ($Mg_xZn_{1-x}O$), cadmium zinc oxide ($Cd_xZn_{1-x}O$), cadmium oxide (CdO), or the like. The semiconductor layers 18h may be formed using ZnO doped with one or more types of impurity elements selected from the chemical elements in group 1, group 13, group 14, group 15, or group 17. ZnO may not be doped with impurity elements. ZnO may be in an amorphous state, a polycrystalline state, or a microcrystalline state where the amorphous state and the polycrystalline state coexist.

The amorphous, In—Ga—Zn—O-based oxide semiconductor is advantageous in that it can be manufactured at a low temperature and it can achieve high mobility. It should be noted that a crystalline, In—Ga—Zn—O-based oxide semiconductor may be used in place of the amorphous, In—Ga—Zn—O-based oxide semiconductor. It is preferable that the c-axis of the crystalline, In—Ga—Zn—O-based oxide semiconductor layer be substantially perpendicular to a layer surface. A thin-film transistor having such an In—Ga—Zn—O-based oxide semiconductor layer is described in, for example, JP 2012-123475A.

In addition to the foregoing description, the semiconductor layers 18h may be constructed using, for example, amorphous silicon, polysilicon, or microcrystalline silicon.

A channel protection layer 30 is provided on the gate insulating film 29 and the semiconductor layers 18h. For example, silicon oxide ($SiO_2$) is used for the channel protection layer 30. It should be noted that the channel protection layer 30 is not an essential element, and the installation thereof may be omitted.

The data bus lines D (source layer), source electrodes 18s of the first thin-film transistors 18 that are constructed integrally with the data bus lines D, and drain electrodes 18d of the first thin-film transistors 18 are provided on the channel protection layer 30. For example, metal films forming a two-layer structure—e.g., layers of a copper film and a titanium film, layers of a copper film and a molybdenum film, and layers of a copper film and a molybdenum alloy film—or metal films forming a three-layer structure—e.g., layers of an aluminum film, a titanium film, and an aluminum film, and layers of a molybdenum film, an aluminum film, and a molybdenum film—are used for the data bus lines D, the source electrodes 18s, and the drain electrodes 18d. There are cases in which a molybdenum film, a chromium film, or a film of an alloy thereof is used as a single layer.

Interlayer insulating films 31 and 32 are sequentially provided so as to cover the data bus lines D, the source electrodes 18s, and the drain electrodes 18d. For example, silicon nitride (SiNx) is used for the interlayer insulating film 31. On the other hand, for example, a photosensitive organic film is used for the interlayer insulating film 32.

The auxiliary capacitance electrode CS is formed on the interlayer insulating film 32. For example, transparent electrode material, such as ITO and IZO, is used for the auxiliary capacitance electrode CS.

An interlayer insulating film 33 is provided so as to cover the interlayer insulating film 32 and the auxiliary capacitance electrode CS. For example, silicon nitride (SiNx) is used for the interlayer insulating film 33. The auxiliary capacitance electrode CS and the later-described pixel electrodes 19 are layered together via the interlayer insulating film 33, thereby forming an auxiliary capacitance on a per-pixel P basis.

The pixel electrodes 19 are formed on the interlayer insulating film 33. For example, transparent electrode material, such as ITO and IZO, is used for the pixel electrodes 19.

As shown in FIG. 6, openings are provided in the interlayer insulating films 32 and 33, and contact holes H1 for connecting the drain electrodes 18d and the pixel electrodes 19 are formed therein.

The liquid crystal panel 2 according to the present embodiment is what is called a liquid crystal panel of a vertical electric field, and uses, for example, pixels P of a continuous pinwheel alignment (CPA) mode, which is one type of a homeotropic alignment mode. Specifically, homeotropic alignment films are provided on the inner surfaces of the active matrix substrate 5 and the counter substrate 4, and the aforementioned liquid crystal layer composed of liquid crystals with negative dielectric constant anisotropy is provided between the homeotropic alignment films. The counter substrate 4 is provided with the aforementioned counter electrode 20. The counter substrate 4 is also provided with objects for alignment control, such as alignment control protrusions CT (FIG. 5), in one-to-one relationship with the pixels P between the aforementioned counter electrode 20 and the homeotropic alignment film thereof. In addition to the foregoing description, cutouts may be provided in the counter electrode 20 in one-to-one relationship with the pixels P as the objects for alignment control in place of the alignment control protrusions CT.

Specifics of the pixels P of the aforementioned CPA mode will now be described.

With regard to the pixels P of the CPA mode, the aforementioned alignment control protrusion CT is positioned in a substantially central portion of each pixel P, and within one pixel, liquid crystals centering around the aforementioned alignment control protrusion CT continuously vary in terms of the alignment direction. That is to say, as the alignment control protrusion CT is provided in the substantially central portion of each pixel P, liquid crystal molecules in the liquid crystal layer are radially aligned around the alignment control protrusion CT, i.e., the central portion of the pixel, at the time of voltage application. By thus using the alignment control protrusions CT, the liquid crystal molecules in the pixels P can be radially aligned at the time of voltage application, and hence viewing angle properties can be improved.

The polymer sustained alignment (PSA) technology is incorporated in the pixels P according to the present embodiment. The PSA technology is intended to form an alignment sustaining layer for pretilting liquid crystals in the absence of voltage so as to restrict the alignment direction of liquid crystal molecules in the absence of voltage. The alignment sustaining layer is formed as a polymer layer by, after forming a liquid crystal cell, photopolymerizing a photopolymerizable monomer (or oligomer) that has been mixed with liquid crystal material in advance, typically in the state where voltage is applied to the liquid crystal layer. The alignment sustaining layer enables liquid crystals to, in the absence of voltage, sustain (remember) the alignment orientations and pretilt angles that are slightly tilted (by, for example, 2° to 3°) with respect to a direction perpendicular to a substrate surface of the active matrix substrate 5. As a result, a response speed related to the liquid crystal alignments at the time of voltage application can be improved. Furthermore, when a surface of the liquid crystal panel 2 has been pressed by a finger, the speed of alignment restoration can be accelerated. That is to say, by incorporating the PSA technology for the pixels P of the CPA mode, the response speed and the speed of restoration following the finger pressing can be advantageously improved.

Voltage application for implementing the PSA technology is performed using the aforementioned terminals 25a or input terminals 25c. That is to say, voltage is supplied to all of the data bus lines D via (the input terminals 25c, the wires 25b,) the terminals 25a, the first common wires 24, the connection wires 35, the second thin-film transistors 23, the aforementioned mounting terminals, and the draw-out lines 22. Furthermore, the gate drivers 17a, 17b are driven by inputting a predetermined signal to the gate driver driving signal terminals 21b, and voltage for turning on the first thin-film transistors 18 is supplied to the gate bus lines G. As a result, voltage supplied to the aforementioned data bus lines D is supplied to the liquid crystal layer via the first thin-film transistors 18, and the alignment sustaining layer is formed.

As indicated by dash lines in FIG. 5, the counter substrate 4 is provided with black matrix films BM that cover the data bus lines D, the first thin-film transistors 18, and the contact holes H1, and an opening is formed on the pixel electrode 19 in each pixel P. The black matrix films BM are provided for the purpose of taking countermeasures against color mixture in the case where the active matrix substrate 5 and the counter substrate 4 are attached in a misaligned manner, shielding channel portions of the first thin-film transistors 18 from light, or taking countermeasures against a decrease in the display quality caused by alignment disorder of liquid crystals at the contact holes H1.

Specifics of the configurations between the draw-out lines 22 and the first common wires 24 will now be described, additionally with reference to FIGS. 7 to 10.

As shown in FIGS. 7 and 8, on the active matrix substrate 5 according to the present embodiment, draw-out lines 22r, 22g, and 22b are provided, for example, in correspondence with the colors R, G, and B, respectively. The draw-out lines 22r, 22g, and 22b are connected to the data bus lines D corresponding to R, G, and B, respectively. The aforementioned mounting terminals DT1 and DT2 are connected, respectively via terminal contact holes H2a and H2b, to the corresponding draw-out lines 22r, 22g, 22b. The second thin-film transistors 23a and 23b are connected to the mounting terminals DT1 and DT2, respectively. The second thin-film transistors 23a or 23b are each connected to one of connection wires 35r, 35g, and 35b that are provided in correspondence with R, G, and B, respectively. First common wires 24r, 24g, and 24b that are provided respectively in correspondence with R, G, and B, are connected to the connection wires 35r, 35g, and 35b via terminal contact holes H3r, H3g, and H3b, respectively. In this way, the data bus lines D corresponding to R, G, and B are connected respectively to the first common wires 24r, 24g, and 24b, and different inspection signals can be input and independent inspection operations can be performed in one-to-one relationship with the data bus lines D corresponding to R, G, and B.

As described above, on the active matrix substrate 5 according to the present embodiment, a predetermined number of data bus lines D corresponding to R, G, and B are connected to the first common wires 24r, 24g, and 24b, respectively, via a predetermined number of second thin-film transistors 23a or 23b, and an independent inspection operation can be performed for each of the R, G, and B data bus lines D. Therefore, in an inspection where defects are visually detected, single-color display using R, G, or B can be performed. This makes it easy to detect leakages of the data bus lines D.

As shown in FIGS. 7 and 8, the second thin-film transistors 23a that are constructed continuously with the mounting terminals DT1 and the second thin-film transistors 23b that are constructed continuously with the mounting terminals DT2 are staggered in two rows (i.e., two neighboring mounting terminals DT1, DT2 are sequentially shifted so as to be arranged in different positions along a linear direction).

Among the draw-out lines 22r, 22g, 22b, one of two neighboring draw-out lines 22 is formed from the same conductive layer as the gate bus lines G (gate layer), whereas the other of the two neighboring draw-out lines 22 is formed from the same conductive layer as the data bus lines D (source layer) (see FIGS. 9 and 10).

Specifically, in the example shown in FIG. 9, the draw-out line 22r is formed from the same conductive layer as the gate bus lines G on the base member 5a. Also, a gate electrode 23ag of the second thin-film transistor 23a is constructed on the base member 5a. This gate electrode 23ag is constructed integrally with a branch wire 26a (FIG. 7) of the aforementioned control line 26 that is formed from the same conductive layer as the gate bus lines G.

In FIG. 9, an end portion of the draw-out line 22r is used as a first lower-layer terminal electrode 36a of the mounting terminal DT1. This mounting terminal DT1 is provided with a second lower-layer terminal electrode 36b formed from the same conductive layer as the data bus lines D, and an upper-layer terminal electrode 34 formed from the same conductive layer as the pixel electrodes 19. In this mounting terminal DT1, the first lower-layer terminal electrode 36a and the second lower-layer terminal electrode 36b are connected to each other, and the second lower-layer terminal electrode 36b and the upper-layer terminal electrode 34 are connected to each other, via the aforementioned terminal contact hole H2a formed in the gate insulating film 29, the channel protection layer 30, and the interlayer insulating films 31 and 33.

The second lower-layer terminal electrode 36b is constructed integrally with the drain electrode 23ad of the second thin-film transistor 23a. The source electrode 23as of the second thin-film transistor 23a is formed from the same conductive layer as the data bus lines D, similarly to the drain electrode 23ad, and as shown in the example of FIG. 9, the source electrode 23as constitutes an end portion of the aforementioned connection wire 35r.

The semiconductor layer 23ah of the second thin-film transistor 23a is constructed from, for example, an oxide semiconductor, similarly to the semiconductor layers 18h of the first thin-film transistors 18.

The upper-layer terminal electrode 34 of the mounting terminal DT1 is formed so as to cover at least a portion of the second thin-film transistor 23a, and a bump (electrode) of the data driver 16 is connected to the upper-layer terminal electrode 34.

As shown in the example of FIG. 10, a third lower-layer terminal electrode 37a formed from the same conductive layer as the gate bus lines G is provided on the base member 5a. The gate electrode 23bg of the second thin-film transistor 23b is constructed on the base member 5a. This gate electrode 23bg is constructed integrally with a branch wire 26b (FIG. 7) of the aforementioned control line 26 that is formed from the same conductive layer as the gate bus lines G.

In FIG. 10, a portion (end portion) of the draw-out line 22r that is formed from the same conductive layer as the data bus lines D is used as a fourth lower-layer terminal electrode 37b of the mounting terminal DT2. This mounting terminal DT2 is provided with an upper-layer terminal electrode 34 that is formed from the same conductive layer as the pixel electrodes 19. In this mounting terminal DT2, the third lower-layer terminal electrode 37a and the fourth lower-layer terminal electrode 37b are connected to each other, and the fourth lower-layer terminal electrode 37b and the upper-layer terminal electrode 34 are connected to each other, via the aforementioned terminal contact hole H2b formed in the gate insulating film 29, the channel protection layer 30, and the interlayer insulating films 31 and 33.

The fourth lower-layer terminal electrode 37b is constructed integrally with the drain electrode 23bd of the second thin-film transistor 23b. The source electrode 23bs of the second thin-film transistor 23b is formed from the same conductive layer as the data bus lines D, similarly to the drain electrode 23bd, and as shown in the example of FIG. 10, the source electrode 23bs constitutes an end portion of the aforementioned connection wire 35r.

The semiconductor layer 23bh of the second thin-film transistor 23b is constructed from, for example, an oxide semiconductor, similarly to the semiconductor layers 18h of the first thin-film transistors 18.

The upper-layer terminal electrode 34 of the mounting terminal DT2 is formed so as to cover at least a portion of the second thin-film transistor 23b, and a bump (electrode) of the data driver 16 is connected to the upper-layer terminal electrode 34.

As shown in FIG. 7, among the draw-out lines 22 formed from the same conductive layer as the gate bus lines G, and among the draw-out lines 22 formed from the same conductive layer as the data bus lines D, two neighboring draw-out lines 22 are connected respectively to two different first common wires 24.

Specifically, the second draw-out line 22g from the right in FIG. 7 and the fourth draw-out line 22r from the right in FIG. 7 are both formed from the same conductive layer as the gate bus lines G, but these draw-out lines 22g and 22r are connected respectively to different first common wires 24g and 24r.

The first draw-out line 22r from the right in FIG. 7 and the third draw-out line 22b from the right in FIG. 7 are both formed from the same conductive layer as the data bus lines D, but these draw-out lines 22r and 22b are connected respectively to different first common wires 24r and 24b.

As shown in FIG. 7, narrow portions 22ra, 22ga, and 22ba with small widthwise dimensions are provided respectively in the draw-out lines 22r, 22g, and 22b at portions intersecting with the branch wire 26a of the control line 26.

Similarly, narrow portions 35ra, 35ga, and 35ba with small widthwise dimensions are provided respectively in the connection wires 35r, 35g, and 35b at portions intersecting with the branch wire 26b of the control line 26.

By thus providing the narrow portions 22ra, 22ga, 22ba and the narrow portions 35ra, 35ga, 35ba, the areas of intersections between the branch wire 26a and the draw-out lines 22r, 22g, 22b, as well as the areas of intersections between the branch wire 26b and the connection wires 35r, 35g, 35b, can be reduced. As a result, the active matrix substrate 5 according to the present embodiment can inhibit a signal delay in the data bus lines D, and prevent a decrease in the display quality after mounting the chip of the data driver 16 (i.e., the display quality of the liquid crystal display apparatus 1 as a final product). Furthermore, during the inspection, a delay in an inspection control signal for the control line 26 can be inhibited. Therefore, at the time of display for the inspection, unevenness in display can be easily reduced, and erroneous detection of defects can be inhibited.

In addition to the foregoing description, for example, the widthwise dimensions of the branch wires 26a, 26b of the control line 26 may be reduced so as to reduce the areas of intersections with the corresponding draw-out lines 22 and connection wires 35. That is to say, at the aforementioned intersecting portions, at least one of a group of the draw-out lines 22 and the connection wires 35 and a group of the branch wires 26a, 26b may be narrowed.

Furthermore, in FIG. 7, the second thin-film transistors 23a and 23b are in an off state in the liquid crystal display apparatus 1 as a final product. In this way, a decrease in the display quality (shadowing) can be prevented in the liquid crystal display apparatus 1 as a final product.

On the active matrix substrate 5 according to the present embodiment constructed in the foregoing manner, each mounting terminal DT1 has the upper-layer terminal electrode 34, the first lower-layer terminal electrode 36a, and the second lower-layer terminal electrode 36b that are connected to one another via the terminal contact hole H2a. Each mounting terminal DT2 has the upper-layer terminal electrode 34, the third lower-layer terminal electrode 37a, and the fourth lower-layer terminal electrode 37b that are connected to one another via the terminal contact hole H2b. The second thin-film transistors (second switching elements) 23a are arranged between the first common wires 24 and the terminal contact holes H2a, whereas the second thin-film transistors (second switching elements) 23b are arranged between the first common wires 24 and the terminal contact holes H2b. The upper-layer terminal electrodes 34 are provided so as to cover at least portions of the second thin-film transistors 23a or 23b. In this way, the area of connection between each upper-layer terminal electrode 34 and (a bump of) the driver chip of the data driver 16 is not reduced, and therefore the occurrence of defective connection can be inhibited. As a result, on the active matrix substrate 5 according to the present embodiment, unlike the conventional examples described earlier, the second thin-film transistors 23a and 23b can be easily installed even if a region for mounting the data driver 16 is small. As a region for installing the second thin-film transistors 23a and 23b can be downsized in the foregoing manner, it is possible to easily reduce the dimension of the external shape of the active matrix substrate 5, and hence the dimension of the external shape of the liquid crystal display apparatus 1.

In the present embodiment, the three first common wires 24r, 24g, 24b are provided, and a predetermined number of data bus lines D are connected to each of the first common wires 24r, 24g, 24b via a predetermined number of second thin-film transistors 23a or 23b. In this way, the present embodiment enables execution of operation processing, such as inspection processing and voltage application processing, per predetermined number of data bus lines D using the first common wires 24r, 24g, 24b.

In the present embodiment, among the plurality of draw-out lines 22, one of two neighboring draw-out lines 22 is formed from the same conductive layer as the gate bus lines G, whereas the other of the two neighboring draw-out lines 22 is formed from the same conductive layer as the data bus lines D. In this way, the present embodiment can inhibit the occurrence of a short circuit and disconnection of the draw-out lines 22.

In the present embodiment, among the draw-out lines 22 formed from the same conductive layer as the gate bus lines G, and among the draw-out lines 22 formed from the same conductive layer as the data bus lines D, two neighboring draw-out lines 22 are connected respectively to two different first common wires 24. Accordingly, in the present embodiment, an inspection operation to check whether a short circuit has occurred can be easily performed by using the first common wires 24 with respect to the draw-out lines 22 formed from the same conductive layer as the gate bus lines G, as well as the draw-out lines 22 formed from the same conductive layer as the data bus lines D.

In the present embodiment, each mounting terminal DT1 includes the first lower-layer terminal electrode 36a that is constituted by the end portion of the draw-out line formed from the same conductive layer as the gate bus lines G, and the second lower-layer terminal electrode 36b that is constructed integrally with the drain electrode 23ad of the second thin-film transistor 23a and is formed from the same conductive layer as the data bus lines D. In each terminal contact hole H2a, the first lower-layer terminal electrode 36a and the second lower-layer terminal electrode 36b are connected to each other. Accordingly, in the present embodiment, cross-connection between the draw-out lines 22 formed from the same conductive layer as the gate bus lines G and the drain electrodes 23ad of the second thin-film transistors 23a formed from the same conductive layer as the data bus lines D can be implemented at the terminal contact holes H2a. In this way, regions dedicated to such cross-connection need not be provided, and the dimension of the external shape of the active matrix substrate 5 can be easily reduced.

In the present embodiment, each mounting terminal DT2 includes the third lower-layer terminal electrode 37a formed from the same conductive layer as the gate bus lines G, and the fourth lower-layer terminal electrode 37b that is constituted by the end portion of the draw-out line 22 formed from the same conductive layer as the data bus lines D and is constructed integrally with the drain electrode 23bd of the second thin-film transistor 23b. In each terminal contact hole H2b, the third lower-layer terminal electrode 37a and the fourth lower-layer terminal electrode 37b are connected to each other. Accordingly, in the present embodiment, all of the mounting terminals DT1 and DT2 can be constructed in the same manner regardless of the configuration of the draw-out lines 22, and an inspection for the state of the data driver (driver) 16 mounted on the mounting terminals DT1 and DT2 can be easily carried out.

Specifically, while the connection between the driver chip of the data driver 16 and the mounting terminals DT1 or DT2 is established via an anisotropic conductive film (ACF), there are cases in which an inspection for impression of conductive particles included in a conductive layer of the ACF is carried out as a contact inspection after mounting the driver chip. This inspection for impression is intended to measure the number of conductive particles between (bumps of) the driver chip and the mounting terminals DT1 or DT2 by observing the shapes of recesses and projections that are formed on the mounting terminals DT1 or DT2 by conductive particles from a back surface of the active matrix substrate 5. If the mounting terminals DT1 and DT2 have different film structures, a problem could possibly arise where the criteria of determination therefor become complicated. However, in the present embodiment, the mounting terminals DT1 and DT2 have the same film structure, and hence the occurrence of such a problem can be prevented.

In the present embodiment, the oxide semiconductors are used for the semiconductor layers 18h, 23ah, 23bh of the first and second thin-film transistors 18, 23a, 23b. Accordingly, in the present embodiment, the high-performance and compact first and second thin-film transistors 18, 23a, 23b can be easily constructed, and an inspection operation using the first and second thin-film transistors 18, 23a, 23b can be performed with high precision.

The present embodiment uses the active matrix substrate 5 on which the second thin-film transistors (second switching elements) 23 can be easily installed even if the region for mounting the data driver 16 is small. Therefore, the high-performance and compact liquid crystal display apparatus 1 can be easily constructed.

Second Embodiment

Figure 11:
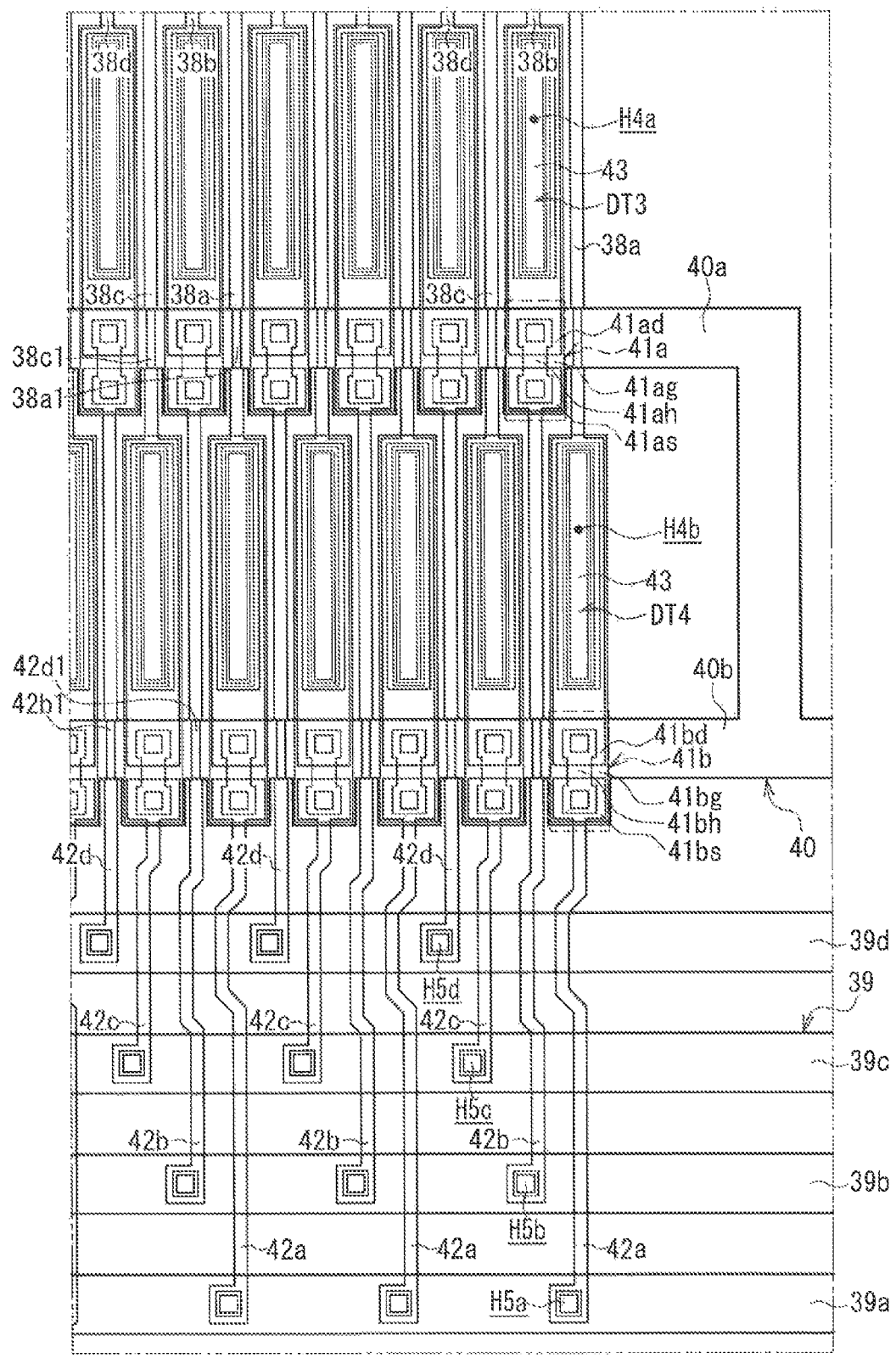
FIG. 11 is a diagram for describing configurations of main elements of an active matrix substrate according to a second embodiment of the present invention.

FIG. 11 is a diagram for describing configurations of main elements of an active matrix substrate according to a second embodiment of the present invention.

Referring to the figure, the present embodiment differs from the first embodiment described earlier mainly in that a portion on which a gate driver is mounted is provided with mounting terminals, second thin-film transistors, and first common wires. It should be noted that the elements that are common to the first embodiment described earlier are given the same reference numerals, and a redundant description thereof is omitted.

That is to say, in FIG. 11, an active matrix substrate 5 according to the present embodiment uses a gate driver (not shown) composed of a driver chip in place of gate drivers 17a and 17b that are monolithically constructed, and this gate driver is mounted on mounting terminals DT3, DT4. A portion on which this gate driver is mounted is provided with draw-out lines 38a, 38b, 38c, 38d connected to gate bus lines G, second thin-film transistors 41a that are provided continuously with the mounting terminals DT3 and serve as second switching elements, and second thin-film transistors 41b that are provided continuously with the mounting terminals DT4 and serve as second switching elements.

Connection wires 42b and 42d are connected to the draw-out lines 38b and 38d, respectively, via the mounting terminals DT3 and the second thin-film transistors 41a. Similarly, connection wires 42a and 42c are connected to the draw-out lines 38a and 38c, respectively, via the mounting terminals DT4 and the second thin-film transistors 41b.

The portion on which the gate driver is mounted is also provided with four first common wires 39, namely, first common wires 39a, 39b, 39c, 39d. The connection wires 42a, 42b, 42c, and 42d are connected to the first common wires 39a, 39b, 39c, and 39d via terminal contact holes H5a, H5b, H5c, and H5d, respectively. A predetermined number of gate bus lines G are connected to each of the first common wires 39a, 39b, 39c, 39d via a predetermined number of second thin-film transistors 41a or 41b.

The draw-out lines 38b, 38d are formed from the same conductive layer as the gate bus lines G, whereas the draw-out lines 38a, 38c are formed from the same conductive layer as data bus lines D.

Similarly to the mounting terminals DT1 shown in the example of FIG. 9, each mounting terminal DT3 is provided with a first lower-layer terminal electrode (not shown) constituted by an end portion of the draw-out line 38b or 38d, a second lower-layer terminal electrode (not shown) formed from the same conductive layer as the data bus lines D, and an upper-layer terminal electrode 43 formed from the same conductive layer as pixel electrodes 19. In each mounting terminal DT3, the first lower-layer terminal electrode and the second lower-layer terminal electrode are connected to each other, and the second lower-layer terminal electrode and the upper-layer terminal electrode 43 are connected to each other, via a terminal contact hole H4a. In each mounting terminal DT3, a bump (electrode) of the driver chip of the gate driver is connected to the upper-layer terminal electrode 43.

Similarly to the mounting terminals DT2 shown in the example of FIG. 10, each mounting terminal DT4 is provided with a third lower-layer terminal electrode (not shown) formed from the same conductive layer as the gate bus lines G, a fourth lower-layer terminal electrode (not shown) constituted by a portion (end portion) of the draw-out line 38a or 38c, and an upper-layer terminal electrode 43 formed from the same conductive layer as the pixel electrodes 19. In each mounting terminal DT4, the third lower-layer terminal electrode and the fourth lower-layer terminal electrode are connected to each other, and the fourth lower-layer terminal electrode and the upper-layer terminal electrode 43 are connected to each other, via a terminal contact hole H4b. In each mounting terminal DT4, a bump (electrode) of the driver chip of the gate driver is connected to the upper-layer terminal electrode 43.

Similarly to the second thin-film transistors 23a shown in the example of FIG. 9, each second thin-film transistor 41a includes a gate electrode 41ag constructed integrally with a branch wire 40a of a control line 40, a semiconductor layer 41ah constructed from an oxide semiconductor, a drain electrode 41ad constructed integrally with the aforementioned second lower-layer terminal electrode, and a source electrode 41as formed from the same conductive layer as the data bus lines D. Each upper-layer terminal electrode 43 is provided so as to cover at least a portion of the second thin-film transistor 41a. Similarly to the source electrodes 23as, each source electrode 41as is constituted by an end portion of the connection wire 42b or 42d formed from the same conductive layer as the data bus lines D.

Similarly to the second thin-film transistors 23b shown in the example of FIG. 10, each second thin-film transistor 41b includes a gate electrode 41bg constructed integrally with a branch wire 40b of the control line 40, a semiconductor layer 41bh constructed from an oxide semiconductor, a drain electrode 41bd constructed integrally with the aforementioned fourth lower-layer terminal electrode, and a source electrode 41bs formed from the same conductive layer as the data bus lines D. Each upper-layer terminal electrode 43 is provided so as to cover at least a portion of the second thin-film transistor 41b. Similarly to the source electrodes 23bs, each source electrode 41bs is constituted by an end portion of the connection wire 42a or 42c formed from the same conductive layer as the data bus lines D.

As shown in FIG. 11, among the draw-out lines 38b, 38d formed from the same conductive layer as the gate bus lines G, and among the draw-out lines 38a, 38c formed from the same conductive layer as the data bus lines D, two neighboring draw-out lines are connected respectively to two different first common wires 39.

Specifically, the draw-out lines 38b and 38d are both formed from the same conductive layer as the gate bus lines G, but these draw-out lines 38b and 38d are connected to different first common wires 39b and 39d, respectively.

On the other hand, the draw-out lines 38a and 38c are both formed from the same conductive layer as the data bus lines D, but these draw-out lines 38a and 38c are connected to different first common wires 39a and 39c, respectively.

As shown in FIG. 11, narrow portions 38a1 and 38c1 with small widthwise dimensions are provided respectively in the draw-out lines 38a and 38c at portions intersecting with the branch wire 40a of the control line 40.

Similarly, narrow portions 42b1 and 42d1 with small widthwise dimensions are provided respectively in the connection wires 42b and 42d at portions intersecting with the branch wire 40b of the control line 40.

By thus providing the narrow portions 38a1, 38c1 and the narrow portions 42b1, 42d1, the areas of intersections between the branch wire 40a and the draw-out lines 38a, 38c, as well as the areas of intersections between the branch wire 40b and the connection wires 42b, 42d, can be reduced. As a result, the active matrix substrate 5 according to the present embodiment can inhibit a signal delay in the gate bus lines G, and prevent a decrease in the display quality after mounting the chip of the gate driver (i.e., the display quality of a liquid crystal display apparatus 1 as a final product). Furthermore, during the inspection, a delay in an inspection control signal for the control line 40 can be inhibited. Therefore, at the time of display for the inspection, unevenness in display can be easily reduced, and erroneous detection of defects can be inhibited.

In addition to the foregoing description, for example, the widthwise dimensions of the branch wires 40a, 40b of the control line 40 may be reduced so as to reduce the areas of intersections with the corresponding draw-out lines 38a, 38c and connection wires 42b, 42d. That is to say, at the aforementioned intersecting portions, at least one of a group of the draw-out lines 38a, 38c and the connection wires 42b, 42d and a group of the branch wires 40a, 40b may be narrowed.

With the foregoing configurations, the present embodiment can achieve the functions and effects similar to those achieved by the first embodiment described earlier. Furthermore, in the present embodiment, with respect to the draw-out lines 38b, 38d formed from the same conductive layer as the gate bus lines G, as well as the draw-out lines 38a, 38c formed from the same conductive layer as the data bus lines D, an operation for detecting a short circuit of each of the draw-out lines 38b, 38d or the draw-out lines 38a, 38c can be easily performed.

Third Embodiment

Figure 12:
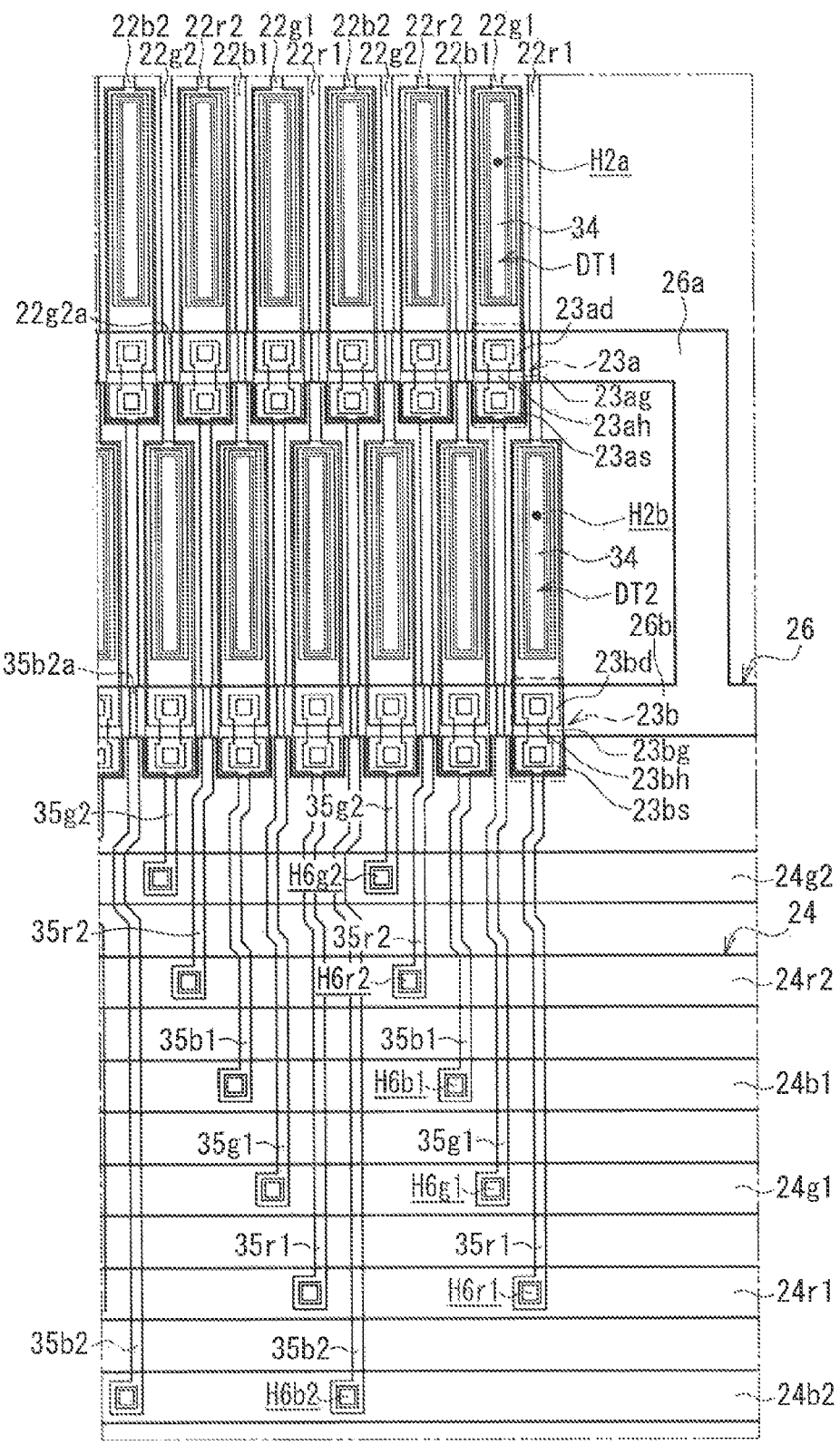
FIG. 12 is a diagram for describing configurations of main elements of an active matrix substrate according to a third embodiment of the present invention.

FIG. 12 is a diagram for describing configurations of main elements of an active matrix substrate according to a third embodiment of the present invention.

Referring to the figure, the present embodiment differs from the first embodiment described earlier mainly in that six first common wires are provided so that, for each of R, G, and B, draw-out lines formed from the same conductive layer as gate bus lines are connected to the same first common wire, and draw-out lines formed from the same conductive layer as data bus lines are connected to the same first common wire. It should be noted that the elements that are common to the first embodiment described earlier are given the same reference numerals, and a redundant description thereof is omitted.

That is to say, in FIG. 12, a portion on which a data driver 16 (not shown) is mounted on an active matrix substrate 5 according to the present embodiment is provided with draw-out lines 22r1, 22g1, 22b1, 22r2, 22g2, 22b2 connected to data bus lines D, the aforementioned mounting terminals DT1 and second thin-film transistors 23a, and the aforementioned mounting terminals DT2 and second thin-film transistors 23b.

Connection wires 35g1, 35r2, and 35b2 are connected to the draw-out lines 22g1, 22r2, and 22b2, respectively, via the mounting terminals DT1 and the second thin-film transistors 23a. Similarly, connection wires 35r1, 35b1, and 35g2 are connected to the draw-out lines 22r1, 22b1, and 22g2, respectively, via the mounting terminals DT2 and the second thin-film transistors 23b.

The portion on which the data driver 16 is mounted is also provided with six first common wires 24, namely, first common wires 24r1, 24g1, 24b1, 24r2, 24g2, 24b2. The connection wires 35r1, 35g1, 35b1, 35r2, 35g2, and 35b2 are connected to the first common wires 24r1, 24g1, 24b1, 24r2, 24g2, and 24b2 via terminal contact holes H6r1, H6g1, H6b1, H6r2, H6g2, and H6b2, respectively. A predetermined number of data bus lines D are connected to each of the first common wires 24r1, 24g1, 24b1, 24r2, 24g2, 24b2 via a predetermined number of second thin-film transistors 23a or 23b.

The draw-out lines 22g1, 22r2, 22b2 are formed from the same conductive layer as the gate bus lines G, whereas the draw-out lines 22r1, 22b1, 22g2 are formed from the same conductive layer as data bus lines D.

As shown in FIG. 12, among the draw-out lines 22g1, 22r2, 22b2 formed from the same conductive layer as the gate bus lines G, and among the draw-out lines 22r1, 22b1, 22g2 formed from the same conductive layer as the data bus lines D, two neighboring draw-out lines are connected respectively to two different first common wires 24.

Specifically, the draw-out lines 22g1 and 22r2 are both formed from the same conductive layer as the gate bus lines G, but these draw-out lines 22g1 and 22r2 are connected to different first common wires 24g1 and 24r2, respectively.

On the other hand, the draw-out lines 22r1 and 22b1 are both formed from the same conductive layer as the data bus lines D, but these draw-out lines 22r1 and 22b1 are connected to different first common wires 24r1 and 24b1, respectively.

As shown in FIG. 12, with regard to the draw-out lines 22r1, 22b1, 22g2, for example, a narrow portion 22g2a with a small widthwise dimension is provided in each draw-out line 22g2 at a portion intersecting with a branch wire 26a of a control line 26.

Similarly, with regard to the connection wires 35g1, 35r2, 35b2, for example, a narrow portion 35b2a with a small widthwise dimension is provided in each connection wire 35b2 in a portion intersecting with a branch wire 26b of the control line 26.

By thus providing the narrow portions 22g2a, 35b2a, the areas of intersections between the branch wire 26a and the draw-out lines 22r1, 22b1, 22g2, as well as the areas of intersections between the branch wire 26b and the connection wires 35g1, 35r2, 35b2, can be reduced. As a result, the active matrix substrate 5 according to the present embodiment can inhibit a signal delay in the data bus lines D, and prevent a decrease in the display quality after mounting a chip of the data driver (i.e., the display quality of a liquid crystal display apparatus 1 as a final product). Furthermore, during the inspection, a delay in an inspection control signal for the control line 26 can be inhibited. Therefore, at the time of display for the inspection, unevenness in display can be easily reduced, and erroneous detection of defects can be inhibited.

In addition to the foregoing description, for example, the widthwise dimensions of the branch wires 26a, 26b of the control line 26 may be reduced so as to reduce the areas of intersections with the corresponding draw-out lines 22r1, 22b1, 22g2 and connection wires 35g1, 35r2, 35b2. That is to say, at the aforementioned intersecting portions, at least one of a group of the draw-out lines 22r1, 22b1, 22g2 and the connection wires 35g1, 35r2, 35b2 and a group of the branch wires 26a, 26b may be narrowed.

With the foregoing configurations, the present embodiment can achieve the functions and effects similar to those achieved by the first embodiment described earlier. Furthermore, in the present embodiment, the draw-out lines 22g1, 22r2, and 22b2 formed from the same conductive layer as the gate bus lines G and the draw-out lines 22r1, 22b1, and 22g2 formed from the same conductive layer as the data bus lines D are connected to the different first common wires 24g1, 24r2, 24b2, 24r1, 24b1, and 24g2, respectively. Accordingly, in the present embodiment, an operation for detecting a short circuit of each of the draw-out lines 22r1, 22g1, 22b1, 22r2, 22g2, 22b2, which are formed from the same conductive layer as the gate bus lines G or from the same conductive layer as the data bus lines D, can be easily performed for each of R, G, and B.

Fourth Embodiment

Figure 13:
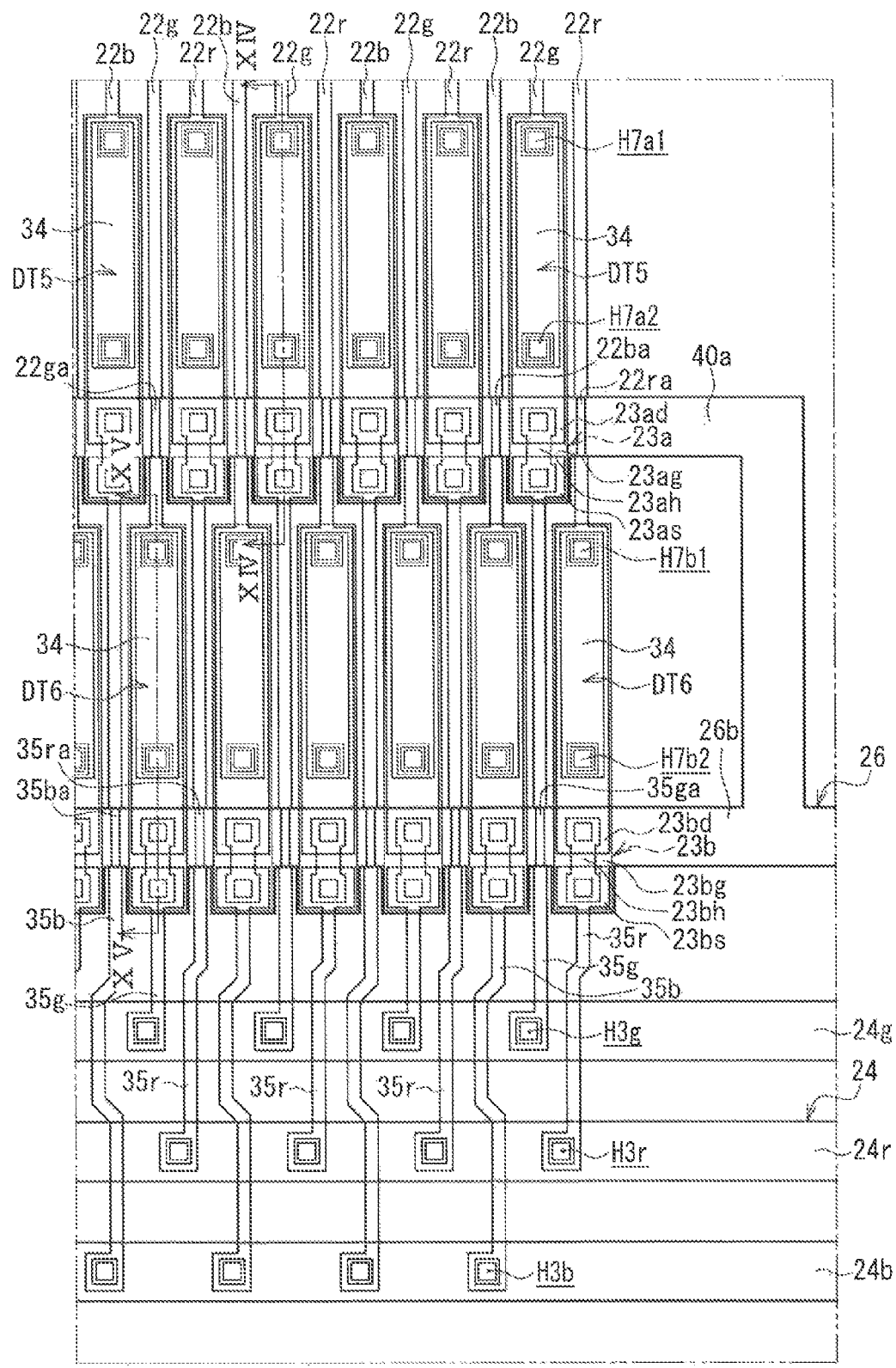
FIG. 13 is a diagram for describing configurations of main elements of an active matrix substrate according to a fourth embodiment of the present invention.
Figure 14:
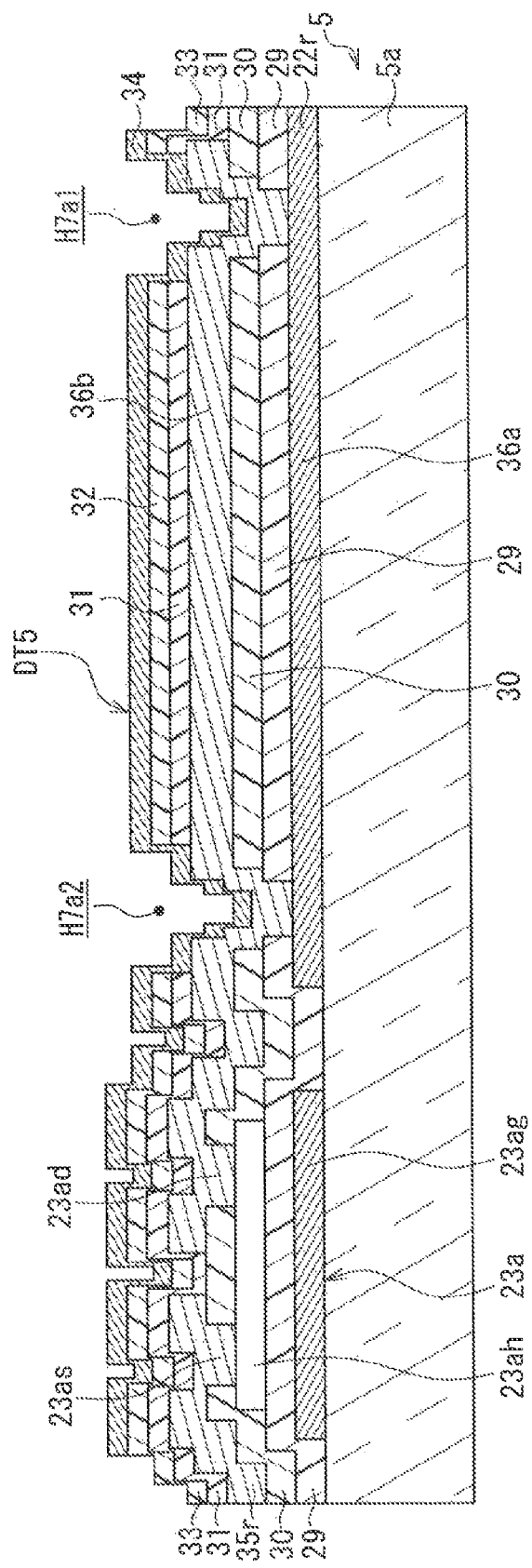
FIG. 14 is a cross-sectional view taken along the line XIV-XIV of FIG. 13.
Figure 15:
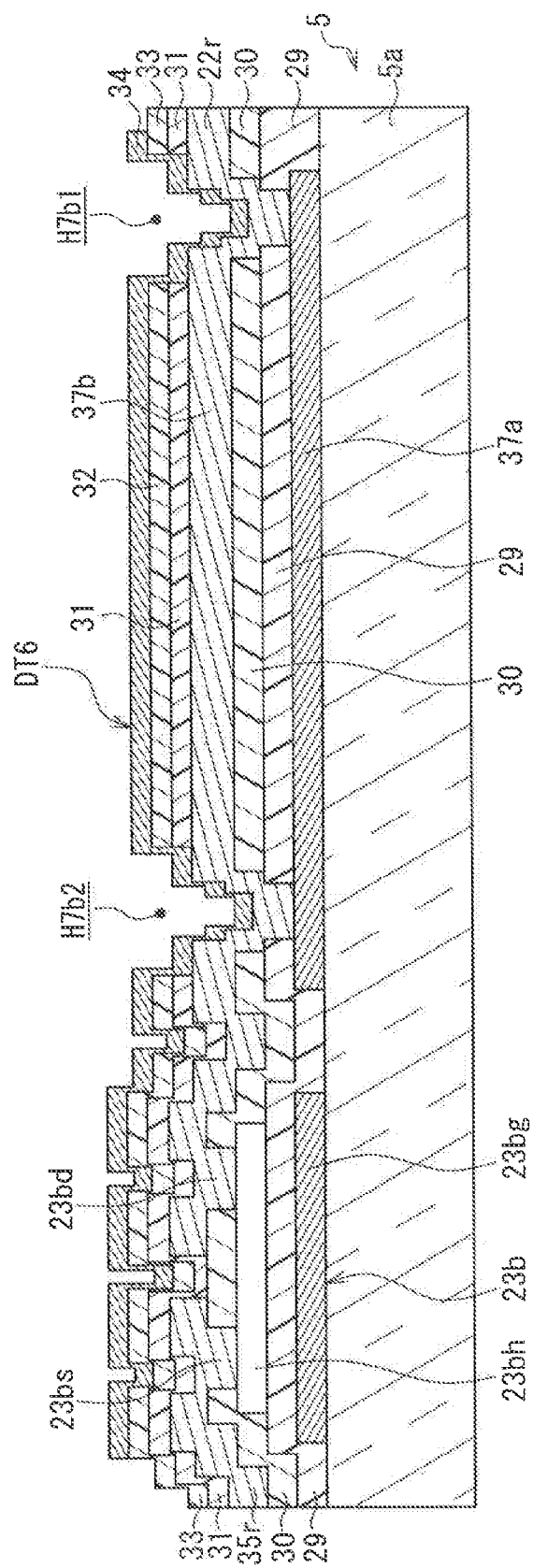
FIG. 15 is a cross-sectional view taken along the line XV-XV of FIG. 13.

FIG. 13 is a diagram for describing configurations of main elements of an active matrix substrate according to a fourth embodiment of the present invention. FIG. 14 is a cross-sectional view taken along the line XIV-XIV of FIG. 13. FIG. 15 is a cross-sectional view taken along the line XV-XV of FIG. 13.

Referring to the figures, the present embodiment differs from the first embodiment described earlier mainly in that each mounting terminal is provided with two terminal contact holes. It should be noted that the elements that are common to the first embodiment described earlier are given the same reference numerals, and a redundant description thereof is omitted.

That is to say, in FIGS. 13 to 15, a portion on which a data driver 16 (not shown) is mounted on an active matrix substrate 5 according to the present embodiment is provided with draw-out lines 22r, 22g, 22b connected to data bus lines D, mounting terminals DT5, the aforementioned second thin-film transistors 23a that are provided continuously with the mounting terminals DT5, mounting terminals DT6, and the aforementioned second thin-film transistors 23b that are provided continuously with the mounting terminals DT6.

Each mounting terminal DT5 is provided with a plurality of, e.g., two terminal contact holes H7a1, H7a2. As shown in the example of FIG. 14, in each mounting terminal DT5, a first lower-layer terminal electrode 36a and a second lower-layer terminal electrode 36b are connected to each other, and the second lower-layer terminal electrode 36b and an upper-layer terminal electrode 34 are connected to each other, via the terminal contact holes H7a1, H7a2. Furthermore, between the two terminal contact holes H7a1 and H7a2 in each mounting terminal DT5, interlayer insulating films 31, 33 are provided between the second lower-layer terminal electrode 36b and the upper-layer terminal electrode 34. Accordingly, as shown in FIG. 14, on the active matrix substrate 5 according to the present embodiment, the difference between the level of a portion of the upper-layer terminal electrode 34 provided with the mounting terminal DT5 and the level of a portion of the upper-layer terminal electrode 34 covering the second thin-film transistor 23a is smaller than that shown in FIG. 9 according to the first embodiment.

Each mounting terminal DT6 is provided with a plurality of, e.g., two terminal contact holes H7b1, H7b2. As shown in the example of FIG. 15, in each mounting terminal DT6, a third lower-layer terminal electrode 37a and a fourth lower-layer terminal electrode 37b are connected to each other, and the fourth lower-layer terminal electrode 37b and the upper-layer terminal electrode 34 are connected to each other, via the terminal contact holes H7b1, H7b2. Furthermore, between the two terminal contact holes H7b1 and H7b2 in each mounting terminal DT6, interlayer insulating films 31, 33 are provided between the fourth lower-layer terminal electrode 37b and the upper-layer terminal electrode 34. Accordingly, as shown in FIG. 15, on the active matrix substrate 5 according to the present embodiment, the difference between the level of a portion of the upper-layer terminal electrode 34 provided with the mounting terminal DT6 and the level of a portion of the upper-layer terminal electrode 34 covering the second thin-film transistor 23b is smaller than that shown in FIG. 10 according to the first embodiment.

With the foregoing configurations, the present embodiment can achieve the functions and effects similar to those achieved by the first embodiment described earlier. In the present embodiment, each mounting terminal DT5 is provided with the two terminal contact holes H7a1, H7a2, and each mounting terminal DT6 is provided with the two terminal contact holes H7b1, H7b2. In this way, the present embodiment can easily reduce defective contact between each of the mounting terminals DT5, DT6 and the data driver 16. Furthermore, in the present embodiment, the difference between the level of the portion of the upper-layer terminal electrode 34 provided with the mounting terminal DT5 and the level of the portion of the upper-layer terminal electrode 34 covering the second thin-film transistor 23a, as well as the difference between the level of the portion of the upper-layer terminal electrode 34 provided with the mounting terminal DT6 and the level of the portion of the upper-layer terminal electrode 34 covering the second thin-film transistor 23b, is smaller than that according to the first embodiment. This makes it possible to reduce defective contact in mounting bumps (electrodes) of a driver chip of the data driver 16. It should be noted that, in the mounting terminals DT1, DT2 according to the first embodiment, defective formation of their terminal contact holes H2a, H2b can be reduced as the areas of the terminal contact holes H2a, H2b are large.

Fifth Embodiment

Figure 16:
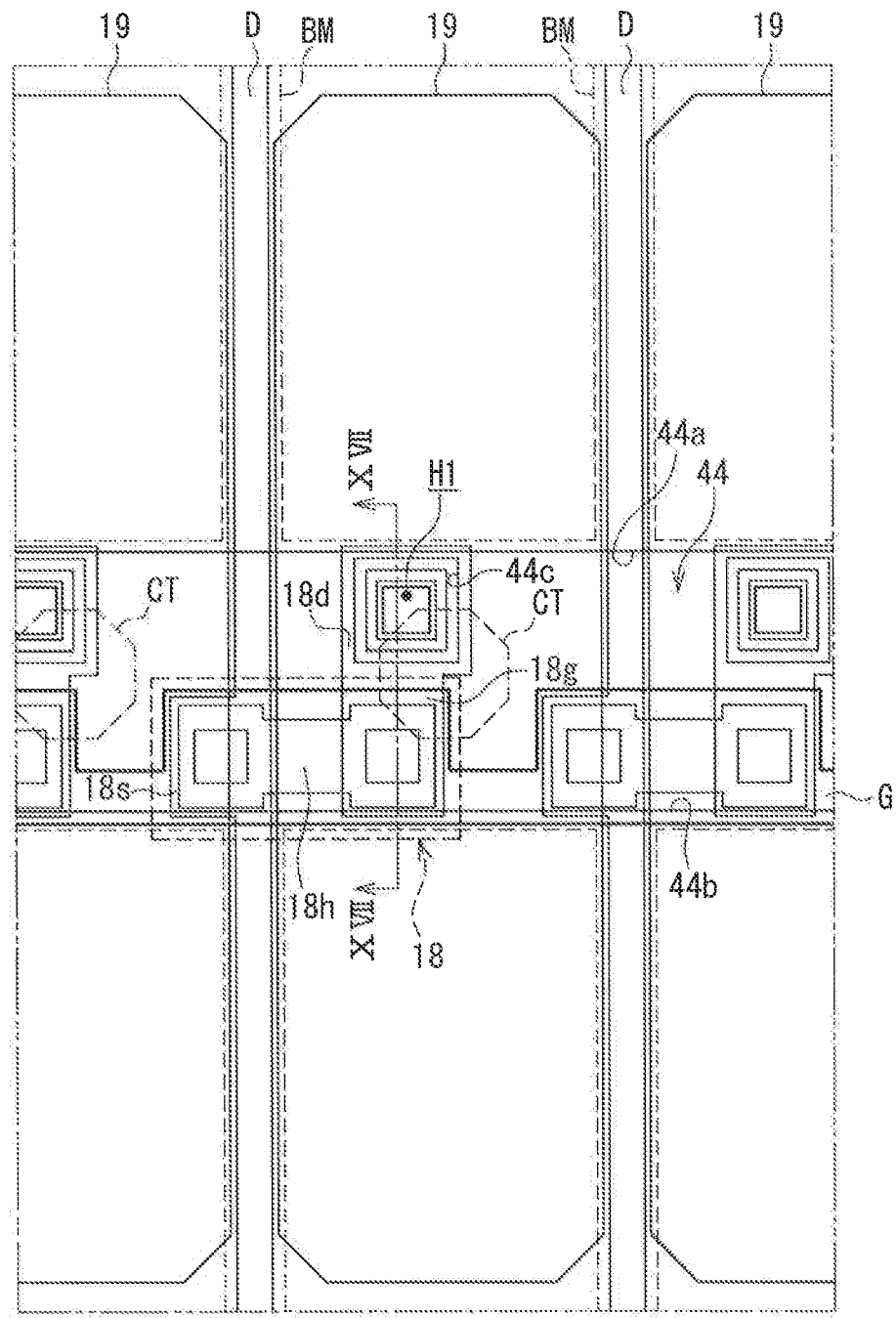
FIG. 16 is an enlarged plan view for describing a pixel structure of a liquid crystal panel incorporating an active matrix substrate according to a fifth embodiment of the present invention.
Figure 17:
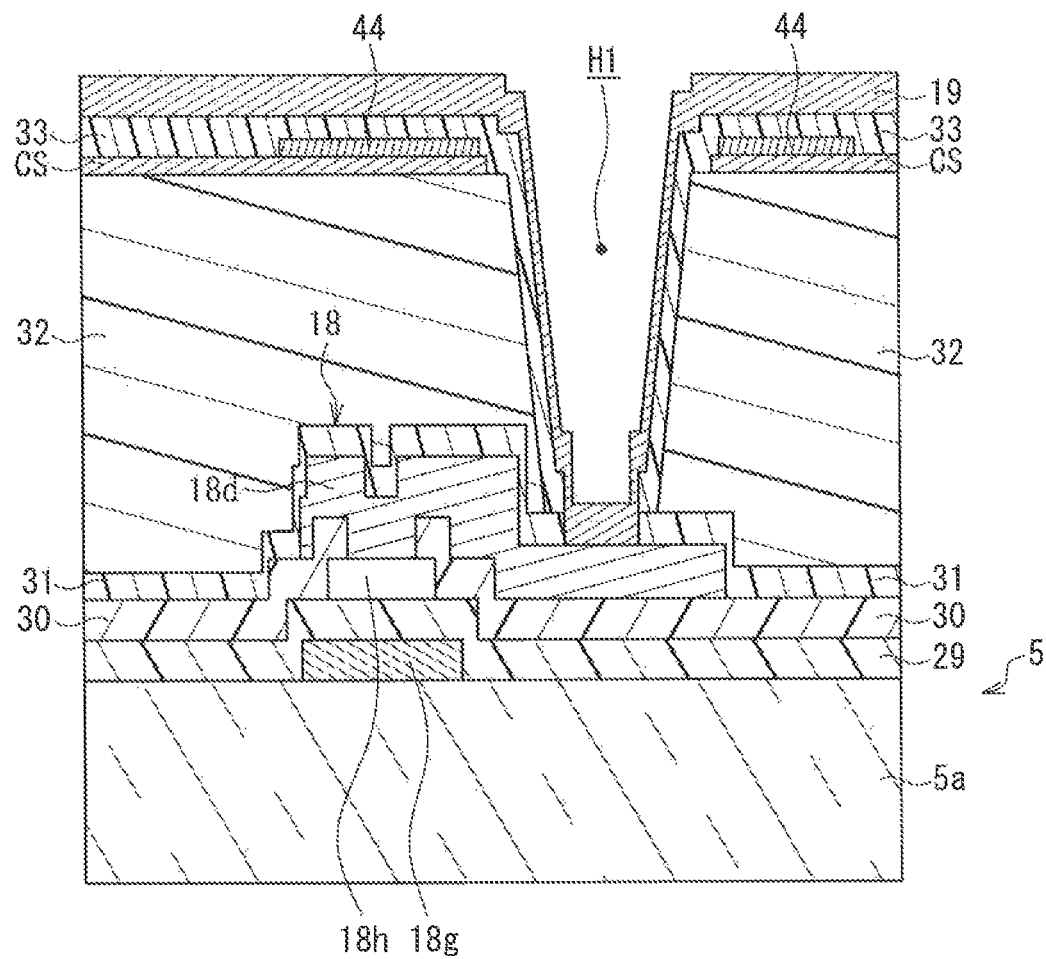
FIG. 17 is a cross-sectional view taken along the line XVII-XVII of FIG. 16.
Figure 18:
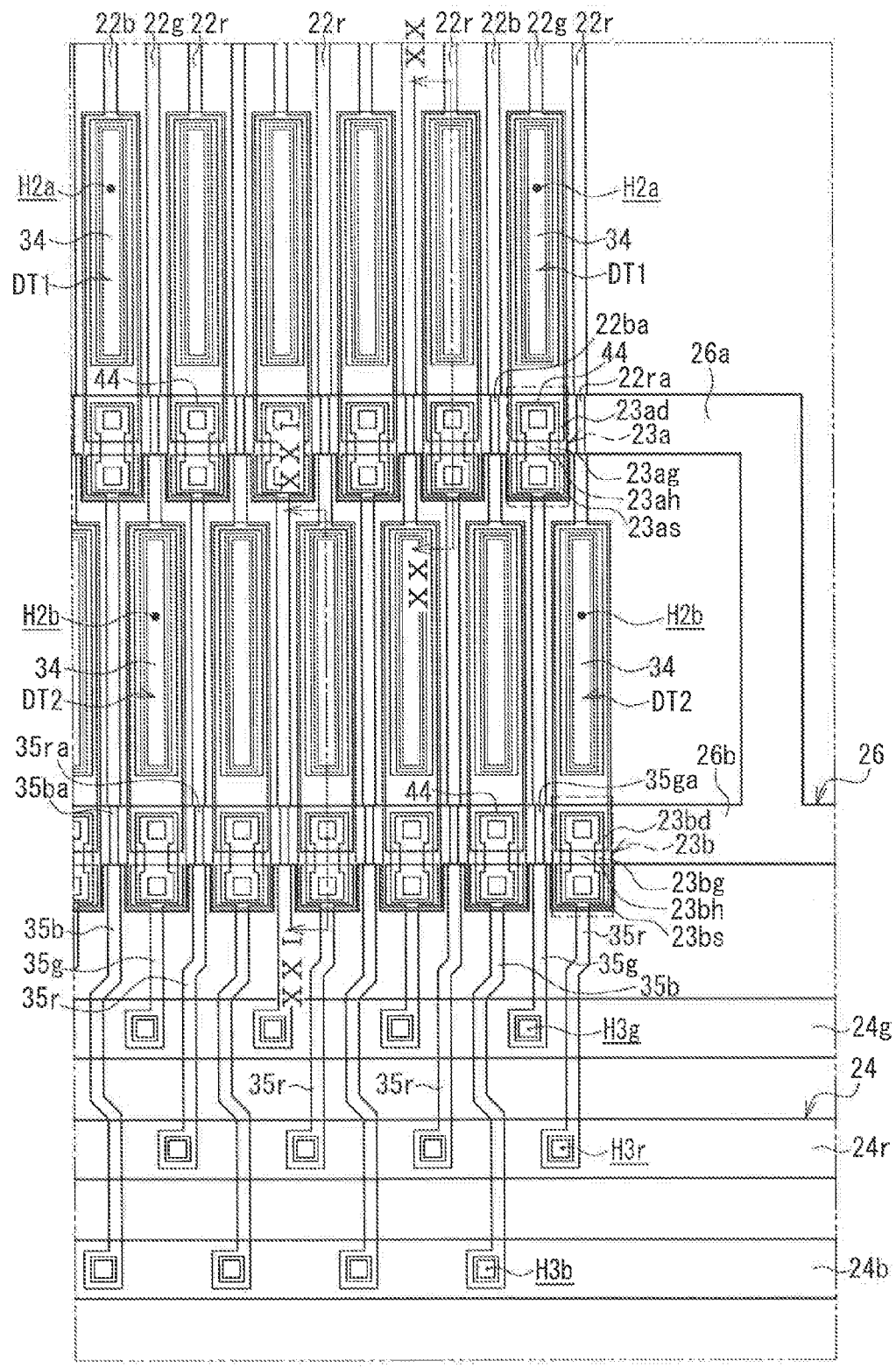
FIG. 18 is a diagram for describing configurations of main elements of the active matrix substrate shown in FIG. 16.
Figure 19:
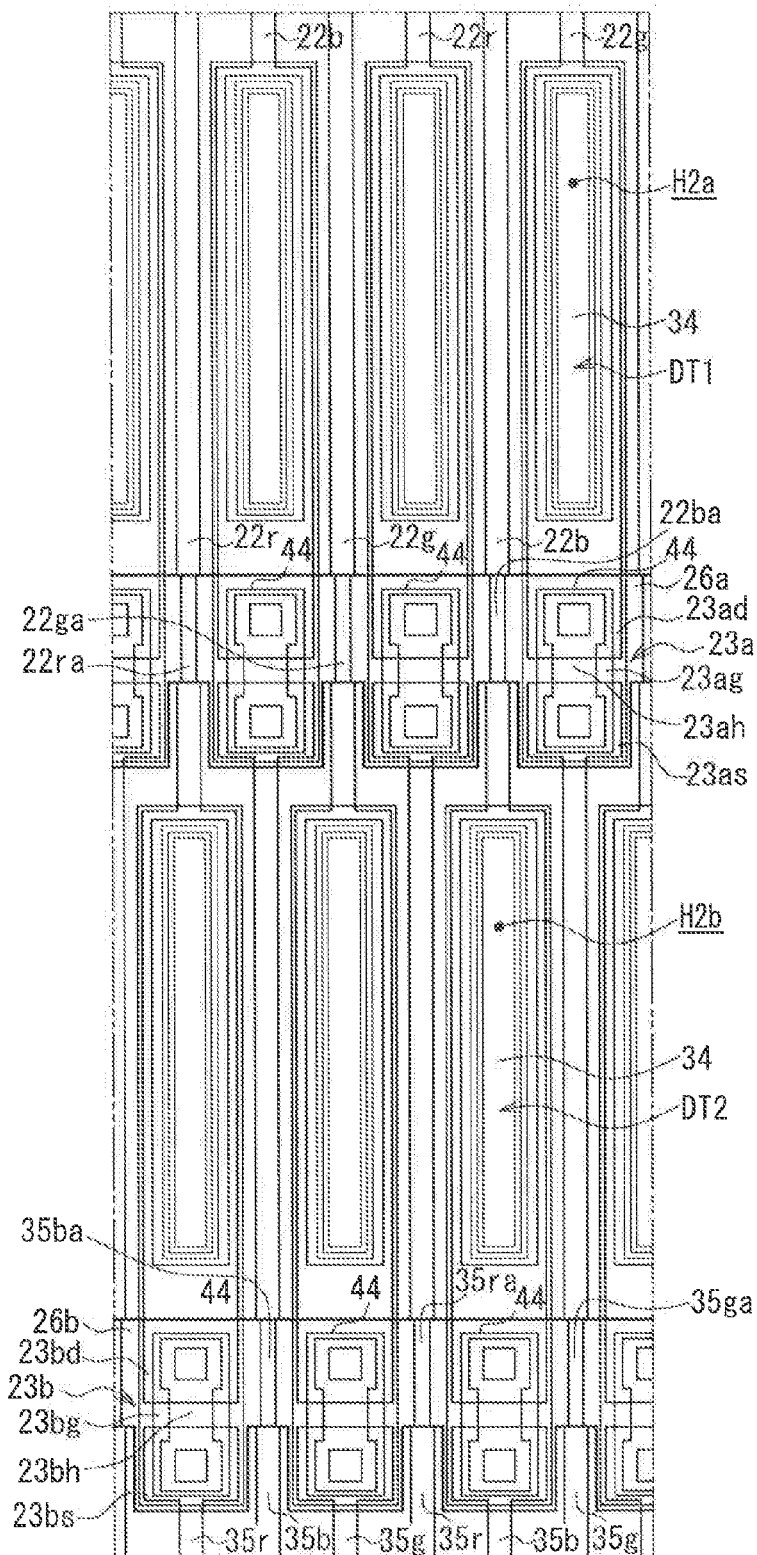
FIG. 19 is an enlarged plan view for describing mounting terminals, second thin-film transistors, and metal electrodes shown in FIG. 18.
Figure 20:
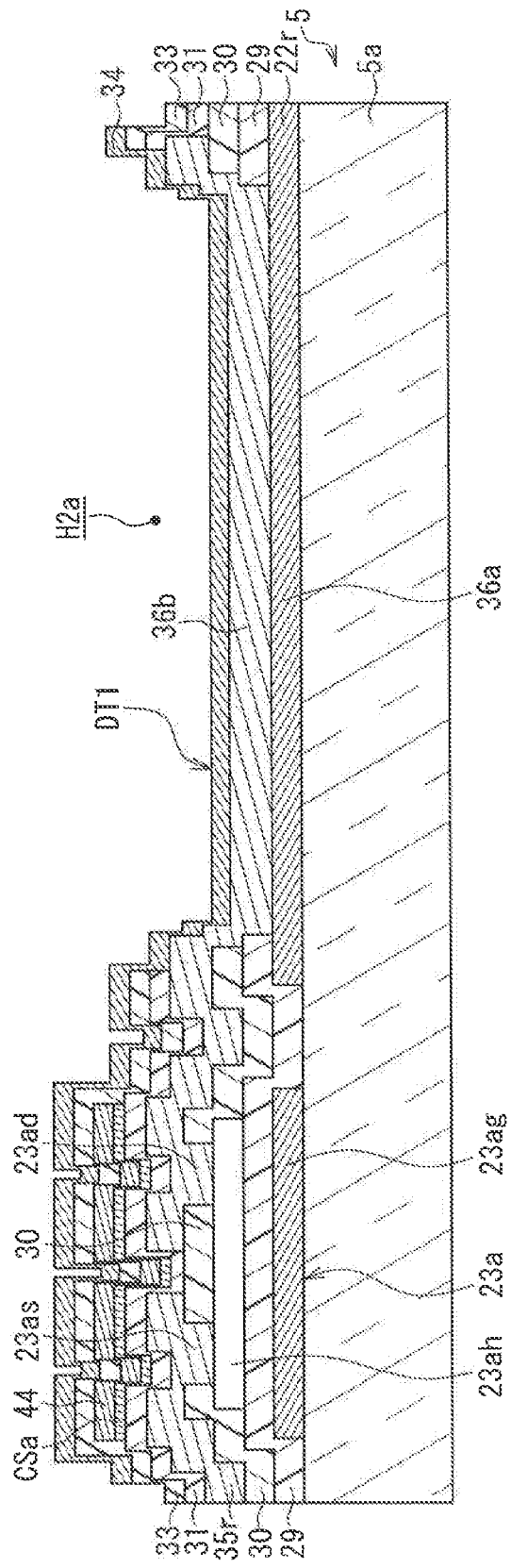
FIG. 20 is a cross-sectional view taken along the line XX-XX of FIG. 18.
Figure 21:
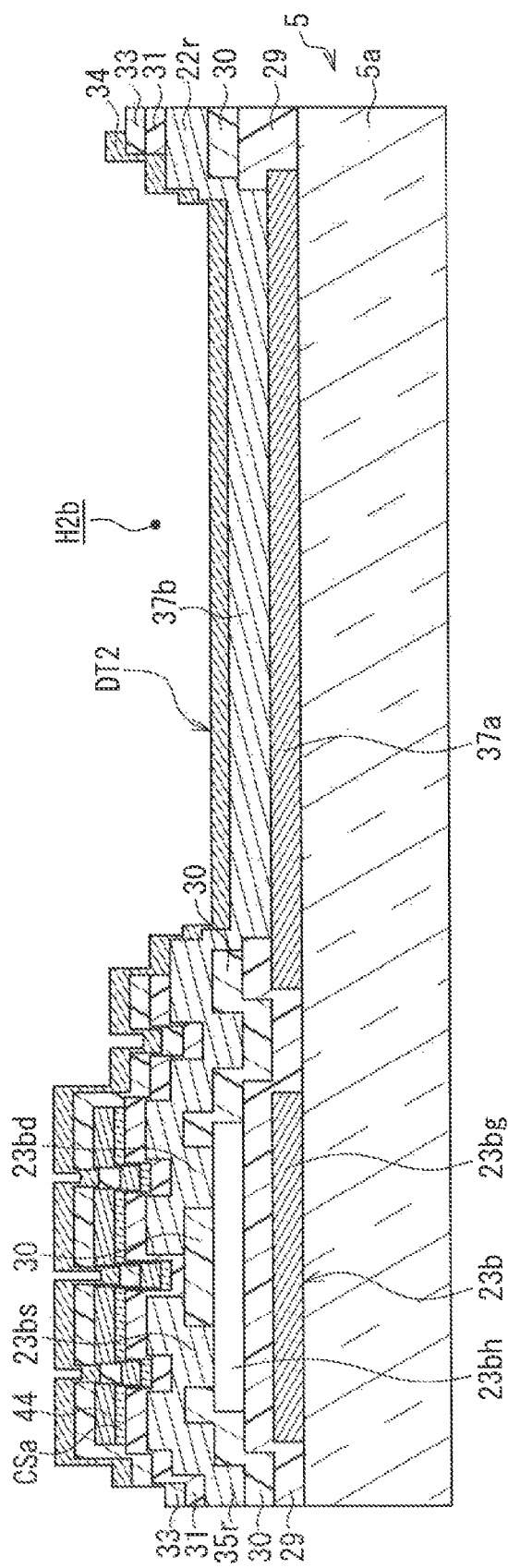
FIG. 21 is a cross-sectional view taken along the line XXI-XXI of FIG. 18.

FIG. 16 is an enlarged plan view for describing a pixel structure of a liquid crystal panel incorporating an active matrix substrate according to a fifth embodiment of the present invention. FIG. 17 is a cross-sectional view taken along the line XVII-XVII of FIG. 16. FIG. 18 is a diagram for describing configurations of main elements of the active matrix substrate shown in FIG. 16. FIG. 19 is an enlarged plan view for describing mounting terminals, second thin-film transistors, and metal electrodes shown in FIG. 18. FIG. 20 is a cross-sectional view taken along the line XX-XX of FIG. 18. FIG. 21 is a cross-sectional view taken along the line XXI-XXI of FIG. 18.

Referring to the figures, the present embodiment differs from the first embodiment described earlier mainly in that metal electrodes are provided in a layer above an auxiliary capacitance electrode (common electrode), and that the metal electrodes are used as light shielding films that cover at least portions of second thin-film transistors. It should be noted that the elements that are common to the first embodiment described earlier are given the same reference numerals, and a redundant description thereof is omitted.

That is to say, in FIGS. 16 to 21, an active matrix substrate 5 according to the present embodiment is provided with metal electrodes 44 in a layer above an auxiliary capacitance electrode (common electrode) CS, and the metal electrodes 44 are used as light shielding films that cover at least portions of second thin-film transistors 23a, 23b. For example, molybdenum, titanium, aluminum, or an alloy or layered films thereof are used for the metal electrodes 44.

Specifically, as shown in FIGS. 16 and 17, strip-shaped metal electrodes 44 are provided with respect to pixels P so as to cover first thin-film transistors 18. That is to say, each metal electrode 44 has edges 44a and 44b that oppose each other, has an opening 44c that is provided so as to surround a contact hole H1, and is provided in parallel to gate bus lines G. As shown in FIG. 17, the metal electrodes 44 are provided below pixel electrodes 19, in a layer above the auxiliary capacitance electrode CS, in such a manner that the metal electrodes 44 are in direct contact with the auxiliary capacitance electrode CS.

As shown in FIGS. 18 and 19, the rectangular metal electrodes 44 are provided in a portion on which a data driver 16 is mounted in such a manner that four edges thereof surround semiconductor layers 23ah, 23bh of the second thin-film transistors 23a, 23b.

As shown in FIG. 20, at the second thin-film transistors 23a, an electrode film CSa formed from the same conductive layer as the metal electrodes 44 and the auxiliary capacitance electrode CS is provided between interlayer insulating films 31 and 33. The metal electrodes 44 are provided above gate electrodes 23ag, the semiconductor layers 23ah, drain electrodes 23ad, and source electrodes 23as of the second thin-film transistors 23a so as to function as light shielding films therefor.

As shown in FIG. 21, at the second thin-film transistors 23b, the electrode film CSa formed from the same conductive layer as the metal electrodes 44 and the auxiliary capacitance electrode CS is provided between the interlayer insulating films 31 and 33. The metal electrodes 44 are provided above gate electrodes 23bg, the semiconductor layers 23bh, drain electrodes 23bd, and source electrodes 23bs of the second thin-film transistors 23b so as to function as light shielding films therefor.

In order to inhibit the generation of a leak current, which will be described later, it is preferable to form the metal electrodes 44 so as to completely cover channel portions of the second thin-film transistors 23a, 23b when viewed from a direction perpendicular to a substrate surface of the active matrix substrate 5.

With the foregoing configurations, the present embodiment can achieve the functions and effects similar to those achieved by the first embodiment described earlier. In the present embodiment, the auxiliary capacitance electrode (common electrode) CS and the metal electrodes 44 are provided. The former is made from transparent electrode material and provided below the pixel electrodes 19, whereas the latter is provided in a layer above the auxiliary capacitance electrode CS. The second thin-film transistors 23a, 23b are covered by the light shielding films formed from the metal electrodes 44. In this way, the present embodiment can inhibit defective display as the metal electrodes 44 are provided in direct contact with the auxiliary capacitance electrode CS. That is to say, while the auxiliary capacitance electrode CS is formed from transparent electrode material, such as ITO and IZO, these ITO and IZO generally have high resistance. Therefore, there is a possibility of the occurrence of defective display, such as flickering and shadowing, attributed to a delay in signals (voltage signals) to the auxiliary capacitance electrode CS, especially when a display region is large. For this reason, in the present embodiment, the metal electrodes 44 are layered on the auxiliary capacitance electrode CS so as to reduce the resistance and inhibit the occurrence of the aforementioned defective display.

As the second thin-film transistors 23a, 23b are covered by the light shielding films formed from the metal electrodes 44, an inspection operation using the second thin-film transistors 23a, 23b and the like can be performed with high precision. That is to say, the light shielding films can alleviate the influences of an inspection environment on display during the inspection, thereby inhibiting an erroneous judgment during the inspection. Specifically, it is possible to prevent the generation of a leak current caused by the incidence of external light on the second thin-film transistors 23a, 23b. Due to the functions of the light shielding films, the second thin-film transistors 23a, 23b need not be coated with resin or a tape with high light shielding properties, or covered by a bezel.

In the pixels P of a display unit, the metal electrodes 44 are used as the light shielding films for the second thin-film transistors 23a, 23b, and the interlayer insulating film 33 is used as a protection film for the light shielding films. In this way, the light shielding films for the second thin-film transistors 23a, 23b can be reliably formed without expanding the manufacturing processes.

In addition to the foregoing description, the metal electrodes 44 may be provided in a layer below the auxiliary capacitance electrode CS in such a manner that the metal electrodes 44 are in direct contact with the auxiliary capacitance electrode CS, or the installation of the electrode film CSa may be omitted.

Sixth Embodiment

Figure 22:
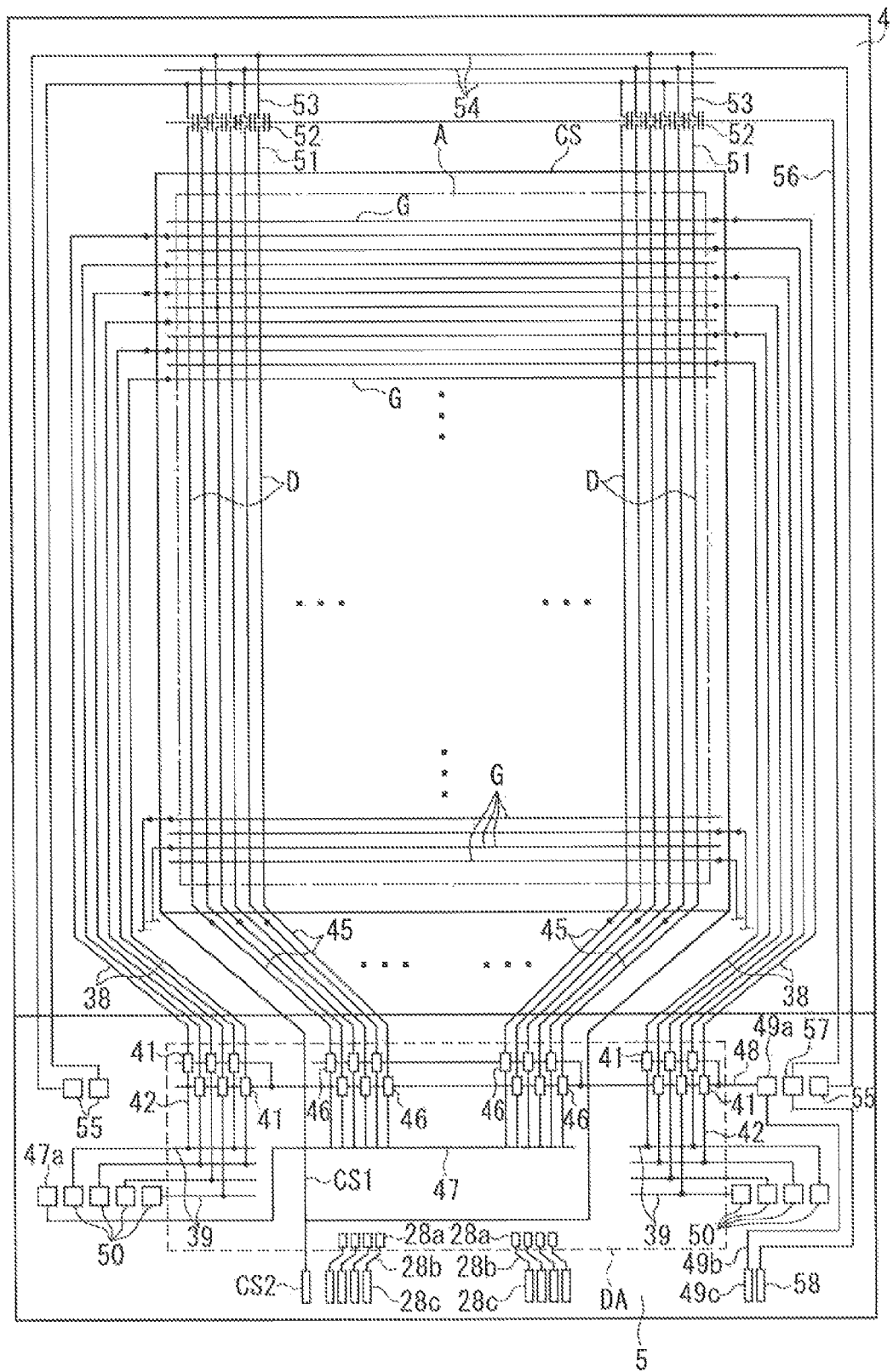
FIG. 22 is a plan view for describing configurations of main elements of a liquid crystal panel incorporating an active matrix substrate according to a sixth embodiment of the present invention.
Figure 23:
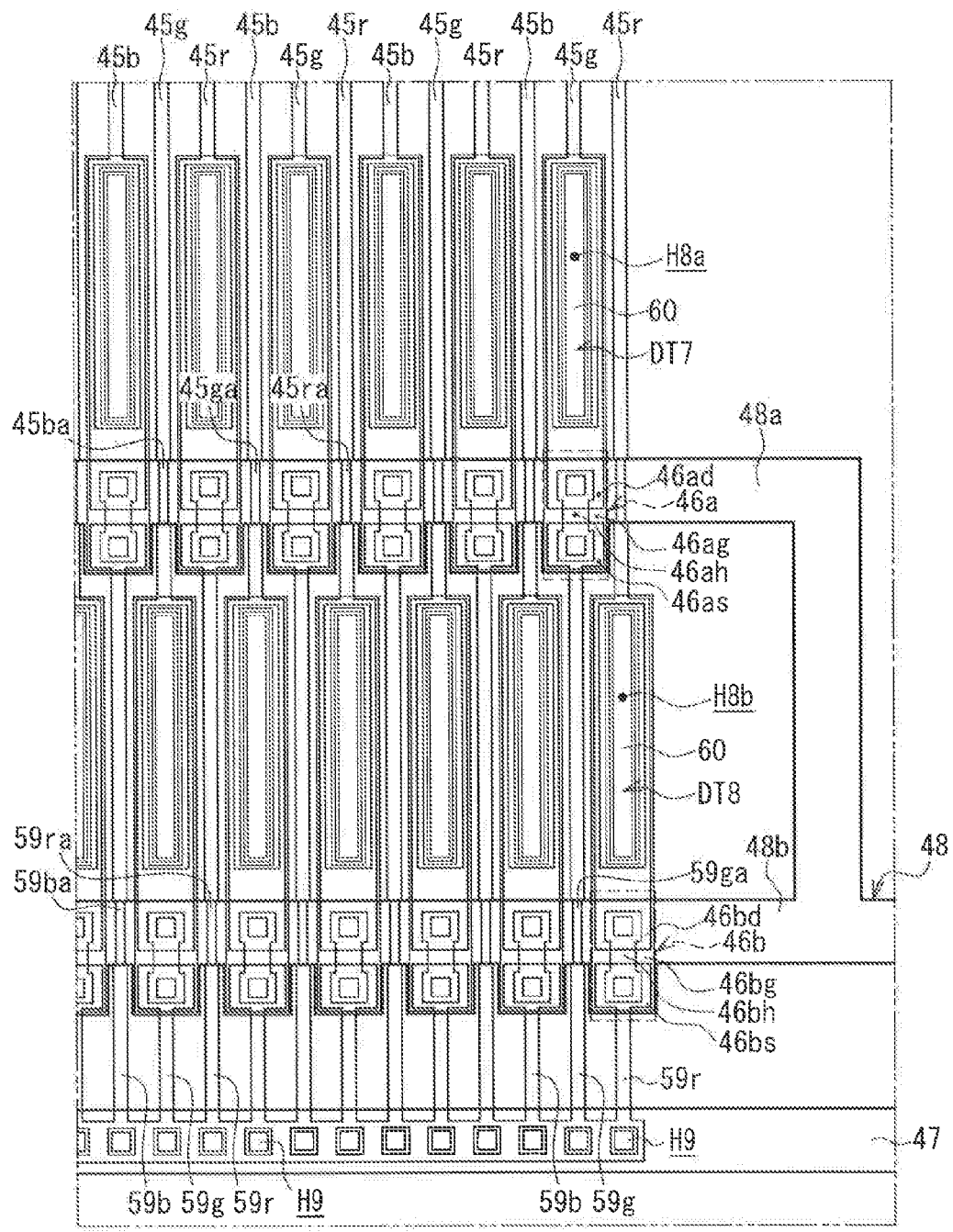
FIG. 23 is a diagram for describing configurations of main elements of the active matrix substrate shown in FIG. 22 in a section with a portion on which a data driver is mounted.
Figure 24:
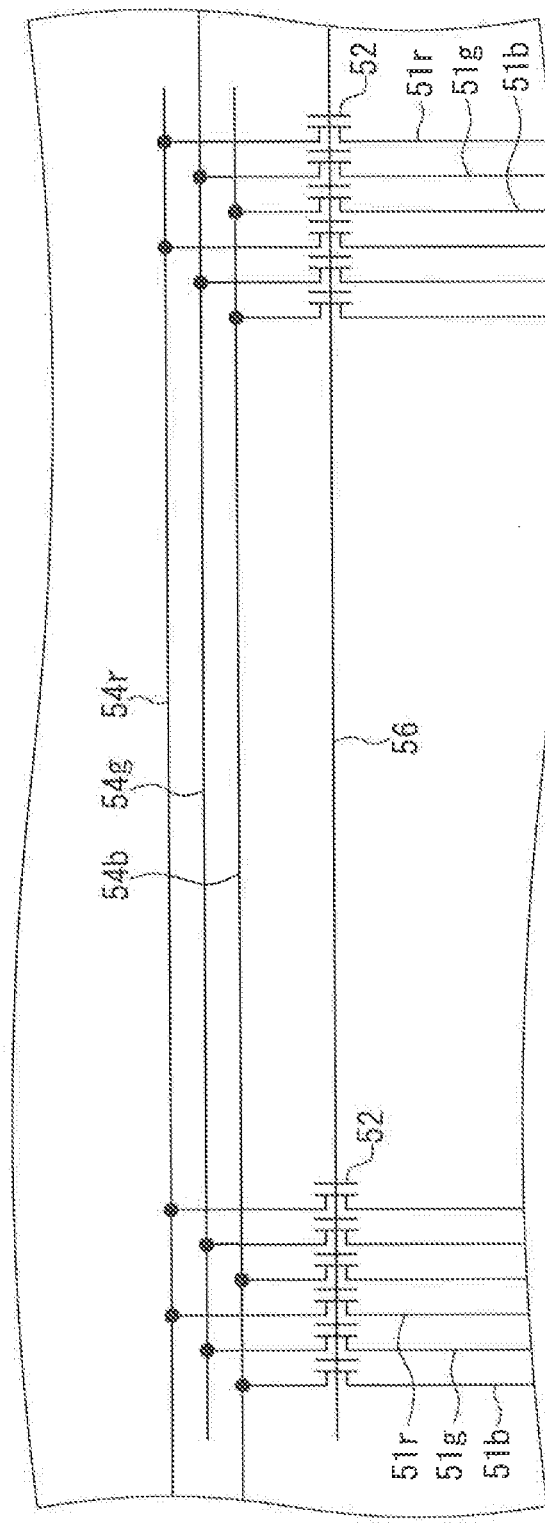
FIG. 24 is a diagram for describing configurations of main elements of the active matrix substrate shown in FIG. 22 in a section that is opposite from the portion on which the data driver is mounted.

FIG. 22 is a plan view for describing configurations of main elements of a liquid crystal panel incorporating an active matrix substrate according to a sixth embodiment of the present invention. FIG. 23 is a diagram for describing configurations of main elements of the active matrix substrate shown in FIG. 22 in a section with a portion on which a data driver is mounted. FIG. 24 is a diagram for describing configurations of main elements of the active matrix substrate shown in FIG. 22 in a section that is opposite from the portion on which the data driver is mounted.

Referring to the figures, the present embodiment differs from the first embodiment described earlier mainly in that third thin-film transistors are provided to end portions of data bus lines that are not connected to mounting terminals, and also in that second common wires that are connected in common to the plurality of third thin-film transistors are provided. It should be noted that the elements that are common to the first embodiment described earlier are given the same reference numerals, and a redundant description thereof is omitted.

That is to say, in FIG. 22, a driver chip (not shown) into which a gate driver and a data driver are integrated is mounted on a region DA of an active matrix substrate 5 according to the present embodiment.

Similarly to the case of FIG. 11 according to the second embodiment, draw-out lines 38 are connected to gate bus lines G. The draw-out lines 38 include draw-out lines 38b, 38d formed from the same conductive layer as the gate bus lines G, and draw-out lines 38a, 38c formed from the same conductive layer as data bus lines D. Mounting terminals DT3 or DT4 (FIG. 11), second thin-film transistors 41, connection wires 42, and first common wires 39 are sequentially connected to the draw-out lines 38. Terminals 50 are connected to the first common wires 39. For example, an inspection signal in inspection processing for the gate bus lines G is supplied thereto.

Draw-out lines 45, later-described mounting terminals, second thin-film transistors 46, later-described connection wires, and one first common wire 47 are sequentially connected to the aforementioned driver chip side of the data bus lines D. A terminal 47a is connected to the first common wire 47. For example, an inspection signal and voltage in inspection processing for the data bus lines D are supplied thereto.

Specifically, as shown in FIG. 23, draw-out lines 45r, 45g, and 45b are provided, for example, in correspondence with the colors R, G, and B, respectively. The draw-out lines 45r, 45g, and 45b are connected to the data bus lines D corresponding to R, G, and B, respectively. The aforementioned mounting terminals DT7 and DT8 are connected, respectively via terminal contact holes H8a and H8b, to the corresponding draw-out lines 45r, 45g, 45b. Second thin-film transistors 46a and 46b are connected to the mounting terminals DT7 and DT8, respectively. The second thin-film transistors 46a or 46b are each connected to one of the aforementioned connection wires 59r, 59g, and 59b that are provided in correspondence with R, G, and B, respectively. One first common wire 47 is connected to the connection wires 59r, 59g, 59b via terminal contact holes H9.

Among the draw-out lines 45r, 45g, 45b, one of two neighboring draw-out lines 45 is formed from the same conductive layer as the gate bus lines G, whereas the other of the two neighboring draw-out lines 45 is formed from the same conductive layer as the data bus lines D.

Similarly to the mounting terminals DT1 shown in the example of FIG. 9, each mounting terminal DT7 is provided with a first lower-layer terminal electrode (not shown) constituted by an end portion of the draw-out line 45, a second lower-layer terminal electrode (not shown) formed from the same conductive layer as the data bus lines D, and an upper-layer terminal electrode 60 formed from the same conductive layer as pixel electrodes 19. In each mounting terminal DT7, the first lower-layer terminal electrode and the second lower-layer terminal electrode are connected to each other, and the second lower-layer terminal electrode and the upper-layer terminal electrode 60 are connected to each other, via the terminal contact hole H8a. In each mounting terminal DT7, a bump (electrode) of the aforementioned driver chip is connected to the upper-layer terminal electrode 60.

Similarly to the mounting terminals DT2 shown in the example of FIG. 10, each mounting terminal DT8 is provided with a third lower-layer terminal electrode (not shown) formed from the same conductive layer as the gate bus lines G, a fourth lower-layer terminal electrode (not shown) constituted by a portion (end portion) of the draw-out line 45, and an upper-layer terminal electrode 60 formed from the same conductive layer as the pixel electrodes 19. In each mounting terminal DT8, the third lower-layer terminal electrode and the fourth lower-layer terminal electrode are connected to each other, and the fourth lower-layer terminal electrode and the upper-layer terminal electrode 60 are connected to each other, via the terminal contact hole H8b. In each mounting terminal DT8, a bump (electrode) of the aforementioned driver chip is connected to the upper-layer terminal electrode 60.

Similarly to the second thin-film transistors 23a shown in the example of FIG. 9, each second thin-film transistor 46a includes a gate electrode 46ag constructed integrally with a branch wire 48a of a control line 48, a semiconductor layer 46ah constructed from an oxide semiconductor, a drain electrode 46ad constructed integrally with the aforementioned second lower-layer terminal electrode, and a source electrode 46as formed from the same conductive layer as the data bus lines D. Each upper-layer terminal electrode 60 is provided so as to cover at least a portion of the second thin-film transistor 46a. Similarly to the source electrodes 23as, each source electrode 46as is constituted by an end portion of the connection wire 59r, 59g, or 59b formed from the same conductive layer as the data bus lines D.

Similarly to the second thin-film transistors 23b shown in the example of FIG. 10, each second thin-film transistor 46b includes a gate electrode 46bg constructed integrally with a branch wire 48b of the control line 48, a semiconductor layer 46bh constructed from an oxide semiconductor, a drain electrode 46bd constructed integrally with the aforementioned fourth lower-layer terminal electrode, and a source electrode 46bs formed from the same conductive layer as the data bus lines D. Each upper-layer terminal electrode 60 is provided so as to cover at least a portion of the second thin-film transistor 46b. Similarly to the source electrodes 23bs, each source electrode 46bs is constituted by an end portion of the connection wire 59r, 59g, or 59b formed from the same conductive layer as the data bus lines D.

As shown in FIG. 22, the control line 48 controls operations to turn on/off the aforementioned second thin-film transistors 41, 46. A terminal 49a is connected to the control line 48. The terminal 49a is also connected to an input terminal 49c via a wire 49b. The FPC connection terminals of the aforementioned FPC 8 are connected to the input terminal 49c. When performing inspection processing and voltage application processing, a control signal for performing an operation to turn on/off each of the second thin-film transistors 41, 46 is input from the terminal 49a or the input terminal 49c. In a liquid crystal display apparatus 1 as a final product, a signal for turning off each of the second thin-film transistors 41, 46 is input to the input terminal 49c via the aforementioned FPC 8.

As shown in FIG. 22, end portions of the data bus lines D that are not connected to the mounting terminals DT7 or DT8 are drawn out to the outside of an effective display region A by a plurality of draw-out lines 51. A third thin-film transistor 52 serving as a third switching element and a connection wire 53 are sequentially connected to each of the plurality of draw-out lines 51. Each of the plurality of connection wires 53 is connected to one of three second common wires 54.

A control line 56 controls operations to turn on/off the third thin-film transistors 52. That is to say, gate electrodes (not shown) of the third thin-film transistors 52 are constructed integrally with the control line 56. A terminal 57 is connected to the control line 56. The terminal 57 is also connected to an input terminal 58 via a wire. The FPC connection terminals of the aforementioned FPC 8 are connected to the input terminal 58. When performing the inspection processing and the voltage application processing, a control signal for performing operations to turn on/off the third thin-film transistors 52 is input from the terminal 57 or the input terminal 58. In the liquid crystal display apparatus 1 as a final product, a signal for turning off each of the third thin-film transistors 52 is input to the input terminal 58 via the aforementioned FPC 8.

The second common wires 54 are connected to corresponding terminals 55 via wires. For example, an inspection signal and voltage in inspection processing for the data bus lines D are supplied to the terminals 55.

Specifically, as shown in FIG. 24, on the active matrix substrate 5 according to the present embodiment, draw-out lines 51r, 51g, and 51b are provided, for example, in correspondence with the colors R, G, and B, respectively. The draw-out lines 51r, 51g, and 51b are connected to end portions of the data bus lines D corresponding to R, G, and B, respectively, at the non-input side. Drain electrodes, not shown, of the third thin-film transistors 52 are connected to the corresponding draw-out lines 51r, 51g, 51b. Source electrodes (not shown) of the third thin-film transistors 52 are each connected to one of the second common wires 54r, 54g, and 54b, which are provided in correspondence with the colors R, G, and B, respectively, via the connection wire 53 (FIG. 22). In other words, the second common wires 54r, 54g, and 54b are connected to the draw-out lines 51r, 51g, and 51b in correspondence with the colors R, G, and B, respectively, via the third thin-film transistors 52. Furthermore, a predetermined number of R, G, and B data bus lines D are connected to the second common wires 54r, 54g, and 54b, respectively. In this way, on the active matrix substrate 5 according to the present embodiment, an inspection operation for the data bus lines D can be performed for each of the colors R, G, B.

That is to say, on the active matrix substrate 5 according to the present embodiment, only one first common wire 47 is provided at the input side of the data bus lines D (i.e., in a section with a portion on which the aforementioned driver chip is mounted). Therefore, in an inspection operation using the first common wire 47, it is possible to detect disconnection of each of the data bus lines D and the draw-out lines 45, failures of first thin-film transistors 18, and the like. However, it is not possible to perform single-color display using R, G, or B and to detect a short circuit between neighboring data bus lines D or between neighboring draw-out lines 45 as in the first embodiment. In view of this, on the active matrix substrate 5 according to the present embodiment, the three second common wires 54r, 54g, and 54b are provided in correspondence with R, G, and B, respectively, at the non-input side of the data bus lines D. This enables single-color display using R, G, or B and detection of a short circuit between neighboring data bus lines D or between neighboring draw-out lines 45, similarly to the first embodiment. It should be noted that disconnection of the draw-out lines 45 cannot be detected in an inspection using the second common wires 54r, 54g, 54b. For this reason, it is preferable to carry out the inspection in combination with an inspection using the first common wire 47.

Similarly to the first embodiment, on the active matrix substrate 5 according to the present embodiment, voltage can be applied from the second common wires 54r, 54g, 54b at the time of alignment processing for a liquid crystal layer (voltage application processing for implementing the PSA technology), and a time period required for the alignment processing can be reduced by applying voltage simultaneously from the first common wire 47.

With the foregoing configurations, the present embodiment can achieve the functions and effects similar to those achieved by the first embodiment described earlier. In the present embodiment, the third thin-film transistors (third switching elements) 52 and the second common wires 54 are provided. The third thin-film transistors 52 are connected to end portions of the data bus lines D that are not connected to the mounting terminals DT7 or DT8, and the second common wires 54 are connected in common to the plurality of third thin-film transistors 52. Accordingly, in the present embodiment, the configurations in a section with the mounting terminals DT7 or DT8, such as the configuration of the aforementioned first common wire 47, can be simplified, and the second thin-film transistors (second switching elements) 46 can be installed more easily even if a region for mounting a driver is small. Furthermore, the present embodiment can downsize the region for mounting the driver. This makes it possible to further downsize the external shape of the active matrix substrate 5, and hence the external shape of the liquid crystal display apparatus 1. Furthermore, the resistance of auxiliary capacitance electrode driving signal wires CS1 for an auxiliary capacitance electrode (common electrode) CS can be reduced by increasing a region for installing the auxiliary capacitance electrode driving signal wires CS1, i.e., by thickening the auxiliary capacitance electrode driving signal wires CS1. As a result, the occurrence of defective display, such as flickering and shadowing, attributed to a delay in signals (voltage signals) to the auxiliary capacitance electrode CS can be inhibited.

It should be noted that the embodiments described earlier are all illustrative and not restrictive. The technical scope of the present invention is defined by the claims, and all changes that come within the range of equivalency of the configurations described in the claims are to be embraced within the technical scope of the present invention.

For example, although the present invention is applied to a transmissive liquid crystal display apparatus in the foregoing description, an active matrix substrate of the present invention is not limited in this way. An active matrix substrate of the present invention can be applied to any display apparatus that includes an effective display region having a plurality of pixels and wires that transmit signals for driving the pixels. For example, the present invention can be adapted into an organic EL display, a microcapsule-type electrophoretic display apparatus, and other display apparatuses. A microcapsule-type electrophoretic display apparatus can display an image by, for example, applying voltage to a microcapsule layer formed in an effective display region on a pixel-by-pixel basis. A display apparatus can include, for example, a substrate provided with wires for an effective display region that are connected, via switching elements, to pixel electrodes provided in one-to-one relationship with pixels, and draw-out lines connected to the wires for the effective display region. This substrate, for example, can be constructed similarly to active matrix substrates according to the embodiments described earlier. Furthermore, an active matrix substrate of the present invention can be applied not only to such a display apparatus, but also to various types of sensor substrates, such as a sensor substrate for an X-ray detection apparatus.

Furthermore, although data bus lines D are provided on gate bus lines G via a gate insulating film (an insulating film) 29 in the foregoing description, it is sufficient that the gate bus lines G and the data bus lines D be provided in different layers via the insulating film on an active matrix substrate of the present invention. The gate bus lines G may be provided on the data bus lines D via the insulating film.

Furthermore, although mounting terminals DT are staggered in two rows in the foregoing description, an active matrix substrate of the present invention is not limited in this way. For example, mounting terminals DT may be staggered in three rows (i.e., three neighboring mounting terminals DT may be sequentially shifted so as to be arranged in different positions along a linear direction).

Furthermore, although the foregoing description involves application to a liquid crystal panel of a CPA mode, which is one type of a homeotropic alignment mode (what is called a liquid crystal panel of a vertical electric field), an active matrix substrate of the present invention is not limited in this way, and can also be applied, for example, to other liquid crystal panels of a homeotropic alignment mode using fishbone-type pixel electrodes, and to liquid crystal panels of a homogeneous alignment mode (what is called liquid crystal panels of a horizontal electric field).

Specifically, given an azimuth system where positive angles are taken counterclockwise starting from 0° pointing at the right side of a horizontal direction (the direction in which gate bus lines extend), a fishbone-type pixel electrode includes a plurality of elongated electrode portions (branch portions) that extend in the angles of, for example, 45°, 135°, 225°, and 315°. Between the elongated electrode portions, an elongated cutout (slit) extending in a corresponding direction is provided. A fishbone-type pixel electrode also includes a backbone portion (stem portion) that is located at a central portion of a pixel and extends along a vertical direction (the direction in which data bus lines extend). Each elongated electrode portion is connected to the backbone portion.

The direction in which the elongated electrode portions (or slits) extend varies with each of four regions that are obtained by dividing a pixel P into quarters, i.e., into two regions in both vertical and horizontal directions. As a result, at the time of voltage application, four liquid crystal alignment regions corresponding to the four regions (liquid crystal alignments in four domains) are formed within one pixel P. Within a liquid crystal domain, the alignment states of liquid crystal molecules are substantially the same. Different domains show different alignment states of liquid crystal molecules.

More specifically, when voltage is applied between a fishbone-type pixel electrode and a counter electrode 20, in each domain, liquid crystal molecules are aligned so as to be inclined parallel to the direction in which the slits extend, with their upper end portions facing the inner side of a pixel P.

In a homeotropic alignment mode using fishbone-type pixel electrodes, objects for alignment control for a counter substrate 4, such as alignment control protrusions CT, are not essential.

Furthermore, it is preferable to implement a homeotropic alignment mode using fishbone-type pixel electrodes in conjunction with the aforementioned polymer sustained alignment (PSA) technology, similarly to a CPA mode.

In a liquid crystal panel of a homogeneous alignment mode, homogeneous alignment films are provided on the inner surfaces of an active matrix substrate 5 and a counter substrate 4, and a liquid crystal layer uses liquid crystals with positive dielectric constant anisotropy. An auxiliary capacitance electrode serving as a common electrode is also used as a counter electrode. In the liquid crystal panel of the homogeneous alignment mode, the alignment of liquid crystals is controlled by forming a plurality of parallel slits (having a width of, for example, 2 μm to 4 μm) in pixel electrodes and generating a horizontal electric field between the pixel electrodes and the aforementioned counter electrode (common electrode). In the homogeneous alignment mode, it is not necessary to form the counter electrode 20 in the counter substrate 4. Furthermore, in the homogeneous alignment mode, the counter electrode serving as the common electrode is made from transparent electrode material and is provided below the pixel electrodes, similarly to the auxiliary capacitance electrode. Moreover, in the homogeneous alignment mode, there is a case in which the counter electrode serving as the common electrode is provided above the pixel electrodes, unlike the auxiliary capacitance electrode. In this case, the aforementioned slits are not formed in the pixel electrodes, and a plurality of parallel slits (having a width of, for example, 2 μm to 4 μm) are formed in the counter electrode.

Although upper-layer terminal electrodes 34, 43, or 60 of mounting terminals DT are formed from the same conductive layer as pixel electrodes 19 in the foregoing description, an active matrix substrate of the present invention is not limited in this way. Upper-layer terminal electrodes and pixel electrodes may be formed from different conductive layers. For example, in a liquid crystal panel of a homogeneous alignment mode, when a counter electrode serving as a common electrode is provided above pixel electrodes, upper-layer terminal electrodes may be formed in the same layer as the counter electrode. It is also possible to form the upper-layer terminal electrodes by newly adding a conductive layer different from the pixel electrodes and the counter electrode.

However, it is preferable to form the upper-layer terminal electrodes and the pixel electrodes from the same conductive layer, as in the embodiments described earlier. In this way, an active matrix substrate with a simple configuration can be easily constructed in simple manufacturing processes.

In the first to fifth embodiments described earlier, gate drivers are monolithically formed on an active matrix substrate. In the sixth embodiment described earlier, a gate driver and a data driver composed of a driver chip (driver IC) are arranged on an active matrix substrate. However, an active matrix substrate of the present invention is not limited in this way. For example, in the sixth embodiment, gate drivers may be monolithically formed on an active matrix substrate.

In the foregoing description, data bus lines are provided for pixels that each correspond to one of the colors red (R), green (G), and blue (B). However, an active matrix substrate of the present invention is not limited in this way. For example, R, G, and B pixels may be sequentially provided with respect to one data bus line.

Although data bus lines are provided for pixels that each correspond to one of three colors in the foregoing description, four or more colors (e.g., R, G, B, and yellow, or R, G, B, and white) may be used.

Although thin-film transistors are used as first to third switching elements in the foregoing description, switching elements of the present invention are not limited in this way. For example, other field-effect transistors may be used.

In addition to the foregoing description, the first to sixth embodiments described earlier may be combined as appropriate.

INDUSTRIAL APPLICABILITY

The present invention is useful for an active matrix substrate on which second switching elements can be easily installed even if a region for mounting a driver is small, and also for a display apparatus incorporating such an active matrix substrate.

DESCRIPTION OF REFERENCE NUMERALS

1: liquid crystal display apparatus (display apparatus)
5: active matrix substrate
5a: base member
16: data driver
17, 17a, 17b: gate driver
18: first thin-film transistor (first switching element)
18d: drain electrode
18s: source electrode
18g: gate electrode
18h: semiconductor layer
19: pixel electrode
22, 22r, 22g, 22b, 38a, 38b, 38c, 38d, 22r1, 22g1, 22b1, 22r2, 22g2, 22b2, 45, 45r, 45g, 45b: draw-out line
23, 23a, 23b, 46, 46a, 46b: second thin-film transistor (second switching element)
23ad, 23bd, 46ad, 46bd: drain electrode
23as, 23bs, 46as, 46bs: source electrode
23ag, 23bg, 46ag, 46bg: gate electrode
23ah, 23bh, 46ah, 46bh: semiconductor layer
24, 24r, 24g, 24b, 39, 39a, 39b, 39c, 39d, 24r1, 24g1, 24b1, 24r2, 24g2, 24b2, 47: first common wire
29: gate insulating film (insulating film)
31, 32, 33: interlayer insulating film
34, 60: upper-layer terminal electrode
36a: lower-layer terminal electrode (first lower-layer terminal electrode)
36b: lower-layer terminal electrode (second lower-layer terminal electrode)
37a: lower-layer terminal electrode (third lower-layer terminal electrode)
37b: lower-layer terminal electrode (fourth lower-layer terminal electrode)
44: metal electrode (light shielding film)
52: third thin-film transistor (third switching element)
54, 54r, 54g, 54b: second common wire
G, G1 to GN: gate bus line
D, D1 to DM: data bus line
DT1 to DT8: mounting terminal
H2a, H2b, H7a1, H7a2, H7b1, H7b2, H8a, H8b: terminal contact hole
CS: auxiliary capacitance electrode (common electrode)

The invention claimed is:

1. An active matrix substrate, comprising:
a base member;
a gate bus line provided on the base member;
a data bus line provided in a layer different from a layer of the gate bus line via an insulating film therebetween;
a first switching element connected to the gate bus line and the data bus line;
an interlayer insulating film provided so as to cover the first switching element, the interlayer insulating film having at least one layer;
a pixel electrode connected to the first switching element;
a plurality of mounting terminals, each for supplying a signal from a driver to a corresponding one of the gate bus line or the data bus line;
a draw-out line connecting the plurality mounting terminals and the gate bus line or the data bus line;
a plurality of second switching elements that are each connected to a corresponding one of a plurality of draw-out lines constituting the draw-out line; and
a first common wire connected in common to the plurality of second switching elements, wherein
in the plurality of mounting terminals, an upper-layer terminal electrode and a lower-layer terminal electrode are connected via a terminal contact hole that is formed in at least one layer in the interlayer insulating film, the lower-layer terminal electrode being formed from at least one of the same conductive layer as the gate bus line and the same conductive layer as the data bus line,
each of the plurality of second switching elements is arranged between the first common wire and a terminal contact hole of a corresponding one of the plurality of mounting terminals that is coupled to a respective one of the plurality of second switching elements, and
the upper-layer terminal electrode is provided so as to cover at least a portion of each of the plurality of second switching elements.

2. The active matrix substrate according to claim 1, further comprising:
a third switching element connected to an end portion of the gate bus line or the data bus line to which the plurality of mounting terminals are not connected; and
a second common wire connected in common to a plurality of third switching elements constituting the third switching element.

3. The active matrix substrate according to claim 2, wherein
the second common wire is constituted by a plurality of second common wires, and
a predetermined number of the third switching elements are connected to each of the plurality of second common wires.

4. The active matrix substrate according to claim 1, wherein
the first common wire is constituted by a plurality of first common wires, and
a predetermined number of the second switching elements are connected to each of the plurality of first common wires.

5. The active matrix substrate according to claim 1, wherein among the plurality of draw-out lines, one of two neighboring draw-out lines is formed from the same conductive layer as the gate bus line, and the other of the two neighboring draw-out lines is formed from the same conductive layer as the data bus line.

6. The active matrix substrate according to claim 5, wherein the first common wire is constituted by a plurality of first common wires, two of the second switching elements that are connected respectively to two neighboring draw-out lines among the draw-out lines formed from the same conductive layer as the gate bus line are each connected to a different one of the first common wires, and two of the second switching elements that are connected respectively to two neighboring draw-out lines among the draw-out lines formed from the same conductive layer as the data bus line are each connected to a different one of the first common wires.

7. The active matrix substrate according to claim 1, wherein the plurality of mounting terminals include:

a first lower-layer terminal electrode constituted by an end portion of a draw-out line formed from the same conductive layer as the gate bus line; and a second lower-layer terminal electrode that is constructed integrally with an electrode of the second switching elements and is formed from the same conductive layer as the data bus line, and the first and second lower-layer terminal electrodes are connected to each other at the terminal contact hole.

8. The active matrix substrate according to claim 1, wherein the plurality of mounting terminals include:

a third lower-layer terminal electrode formed from the same conductive layer as the gate bus line; and a fourth lower-layer terminal electrode that is constituted by an end portion of a draw-out line formed from the same conductive layer as the data bus line and is constructed integrally with an electrode of the second switching elements, and the third and fourth lower-layer terminal electrodes are connected to each other at the terminal contact hole.

9. The active matrix substrate according to claim 1, further comprising:

a common electrode that is made from transparent electrode material and is provided above or below the pixel electrode; and a metal electrode provided in a layer above or below the common electrode, wherein at least a portion of the second switching elements is covered by a light shielding film formed from the metal electrode.

10. The active matrix substrate according to claim 1, wherein in the plurality of mounting terminals, the terminal contact hole is constituted by a plurality of terminal contact holes.

11. The active matrix substrate according to claim 1, wherein the upper-layer terminal electrode is formed from the same conductive layer as the pixel electrode.

12. The active matrix substrate according to claim 1, wherein an oxide semiconductor is used for both the first and second switching elements.

13. A display apparatus incorporating the active matrix substrate according to claim 1.

* * * * *